US012696515B2

(12) United States Patent (10) Patent No.: US 12,696,515 B2
Lin et al. (45) Date of Patent: Jul. 28, 2026

(54) SOURCE/DRAIN CONTACTS AND METHODS FOR FORMING THE SAME

(71) Applicant: Taiwan Semiconductor Manufacturing Company, Ltd., Hsin-Chu (TW)

(72) Inventors: Ta-Chun Lin, Hsinchu (TW); Jhon Jhy Liaw, Hsinchu County (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 447 days.

(21) Appl. No.: 18/335,380

(22) Filed: Jun. 15, 2023

(65) Prior Publication Data

US 2024/0421200 A1 Dec. 19, 2024

(51) Int. Cl.
*H10D 64/23* (2025.01)
*H10D 64/27* (2025.01)
*H10D 84/83* (2025.01)

(52) U.S. Cl.
CPC ......... *H10D 64/251* (2025.01); *H10D 64/517* (2025.01); *H10D 84/83* (2025.01)

(58) Field of Classification Search
CPC ....... H10D 64/605; H10D 64/665–669; H10D 30/0215; H10D 30/611; H10D 30/615; H10D 30/023; H10D 84/014–0142; H10D 84/0177; H10D 84/0151; H10D 84/0188; H10D 64/251; H10D 64/517; H10D 84/83; H10D 30/6219; H10D 84/0167;

H10D 84/017; H10D 64/518; H10D 84/0186; H10D 84/85; H10D 30/501; H10D 62/121; H10D 30/62; H01L 21/28061;

(Continued)

(56) References Cited

U.S. PATENT DOCUMENTS 5,834,807 A * 11/1998 Kim ........................ H10B 69/00
257/314
5,879,998 A * 3/1999 Krivokapic .......... H10D 62/151
257/E21.546

(Continued)

FOREIGN PATENT DOCUMENTS

TW        202303984 A    1/2023
TW        202305948 A    2/2023

*Primary Examiner* — Maliheh Malek

(74) *Attorney, Agent, or Firm* — HAYNES AND BOONE, LLP

(57)        ABSTRACT

Semiconductor structures and methods of forming the same are provided. In an embodiment, an exemplary semiconductor structure includes a source/drain feature over a substrate; a metal gate structure extending lengthwise along a first direction and adjacent to the source/drain feature; a gate isolation structure extending lengthwise along a second direction substantially perpendicular to the first direction, and a source/drain contact electrically coupled to the source/drain feature and including a first portion directly above the source/drain feature and a second portion extending from the first portion along the first direction. In embodiments, the gate isolation structure divides the metal gate structure into two isolated portions. In embodiments, the first portion has a first width along the second direction and the second portion has a second width along the second direction, the first width being greater than the second width.

20 Claims, 19 Drawing Sheets

(58) Field of Classification Search
CPC .......................... H01L 21/28079–28088; H01L
21/32051–32053; H01L 21/28097; H01L
21/28114; H01L 21/76224–76237; B82Y
10/00
See application file for complete search history.

(56) References Cited

U.S. PATENT DOCUMENTS

| | | | | |
|---|---|---|---|---|
| 6,268,622 | B1 * | 7/2001 | Shone ................. | H10D 30/685 |
| | | | | 257/329 |
| 8,772,109 | B2 * | 7/2014 | Colinge ................ | H10D 30/62 |
| | | | | 438/269 |
| 8,785,285 | B2 * | 7/2014 | Tsai .................... | H10D 30/024 |
| | | | | 257/E21.409 |
| 8,816,444 | B2 * | 8/2014 | Wann .................. | H10D 84/834 |
| | | | | 716/110 |
| 8,823,065 | B2 * | 9/2014 | Wang .................. | H10D 62/021 |
| | | | | 257/745 |
| 8,860,148 | B2 * | 10/2014 | Hu ...................... | H10D 84/811 |
| | | | | 257/369 |
| 9,105,490 | B2 * | 8/2015 | Wang ................. | H10W 20/048 |
| 9,236,267 | B2 * | 1/2016 | De ...................... | G03F 1/38 |
| 9,236,300 | B2 * | 1/2016 | Liaw ................. | H10W 20/0698 |
| 9,520,482 | B1 * | 12/2016 | Chang ................. | H10D 84/038 |
| 9,576,814 | B2 * | 2/2017 | Wu .................... | H10W 20/089 |
| 10,985,165 | B2 * | 4/2021 | Lee .................... | H10B 12/053 |
| 11,688,778 | B2 * | 6/2023 | Ha ....................... | H10D 30/797 |
| | | | | 257/76 |
| 12,142,686 | B2 * | 11/2024 | Stamper ............ | H10D 30/6744 |
| 12,525,485 | B2 * | 1/2026 | Chuang ............. | H10W 20/056 |
| 2017/0104062 | A1 * | 4/2017 | Bi ...................... | H10P 14/3462 |
| 2017/0338309 | A1 * | 11/2017 | Liu .................... | H10D 64/117 |
| 2018/0308797 | A1 * | 10/2018 | Tsai .................. | H10D 30/6211 |
| 2019/0067490 | A1 * | 2/2019 | Yang ................. | H10D 30/6735 |
| 2019/0393320 | A1 * | 12/2019 | Yoo .................... | H10D 64/513 |
| 2020/0043919 | A1 * | 2/2020 | Ching ................. | H10D 84/834 |
| 2020/0044025 | A1 * | 2/2020 | Liu .................... | H10D 62/151 |

| | | | | |
|---|---|---|---|---|
| 2020/0227421 | A1 * | 7/2020 | Jeong ................. | H10B 10/12 |
| 2020/0365690 | A1 * | 11/2020 | Jeong ................. | H10D 64/017 |
| 2020/0373413 | A1 * | 11/2020 | Song ................. | H10D 30/025 |
| 2020/0411641 | A1 * | 12/2020 | Noh .................... | H10D 30/797 |
| 2021/0057418 | A1 * | 2/2021 | Lee .................... | H10B 12/053 |
| 2021/0104529 | A1 * | 4/2021 | Choi .................. | H10B 12/053 |
| 2021/0126095 | A1 * | 4/2021 | Lee ........................ | H10D 30/60 |
| 2021/0175126 | A1 * | 6/2021 | Wu .................... | H10D 84/0158 |
| 2021/0391431 | A1 * | 12/2021 | Huang .............. | H10D 30/6219 |
| 2022/0109055 | A1 * | 4/2022 | Lee .................... | H10D 30/6219 |
| 2022/0139773 | A1 * | 5/2022 | Wang ................. | H10P 70/234 |
| | | | | 257/774 |
| 2022/0208967 | A1 * | 6/2022 | Ko ........................ | H10D 62/121 |
| 2022/0310594 | A1 * | 9/2022 | Jeong ................. | H10D 64/017 |
| 2022/0344482 | A1 * | 10/2022 | Wu .................... | H10D 64/258 |
| 2022/0367194 | A1 * | 11/2022 | Lu ..................... | H10D 64/0112 |
| 2023/0197803 | A1 * | 6/2023 | Park .................... | H10D 62/121 |
| | | | | 257/347 |
| 2023/0298934 | A1 * | 9/2023 | Hsiung .............. | H10W 20/081 |
| | | | | 257/288 |
| 2024/0030289 | A1 * | 1/2024 | Cho .................. | H10D 62/235 |
| 2024/0055476 | A1 * | 2/2024 | Chang ............... | H10D 62/115 |
| 2024/0079277 | A1 * | 3/2024 | Huang ............... | H10D 84/038 |
| 2024/0105787 | A1 * | 3/2024 | Chang .............. | H10D 30/6729 |
| 2024/0170339 | A1 * | 5/2024 | Hsiung ............... | H10D 84/038 |
| 2024/0194606 | A1 * | 6/2024 | Wu ..................... | H10B 43/27 |
| 2024/0194752 | A1 * | 6/2024 | You ................. | H10D 30/43 |
| 2024/0266410 | A1 * | 8/2024 | Chen ................. | H10D 30/014 |
| 2024/0332408 | A1 * | 10/2024 | Chang ................. | H10D 30/43 |
| 2024/0347610 | A1 * | 10/2024 | Ganguly ........... | H10D 30/6729 |
| 2024/0407171 | A1 * | 12/2024 | Kim ................. | H10B 43/40 |
| 2025/0006559 | A1 * | 1/2025 | Li ...................... | H10D 84/0153 |
| 2025/0079265 | A1 * | 3/2025 | Na ..................... | H10W 20/20 |
| 2025/0133787 | A1 * | 4/2025 | Park .................... | H10D 30/62 |
| 2025/0151382 | A1 * | 5/2025 | Chung ............... | H10D 62/121 |
| 2025/0159918 | A1 * | 5/2025 | Wang ................. | H10D 30/024 |
| 2025/0221001 | A1 * | 7/2025 | Liaw ................. | H10D 84/85 |
| 2025/0234578 | A1 * | 7/2025 | Cheng .............. | H10D 30/6215 |
| 2025/0267917 | A1 * | 8/2025 | Brun ................. | H10D 64/257 |
| 2025/0267925 | A1 * | 8/2025 | Huang .............. | H10D 84/0149 |

* cited by examiner

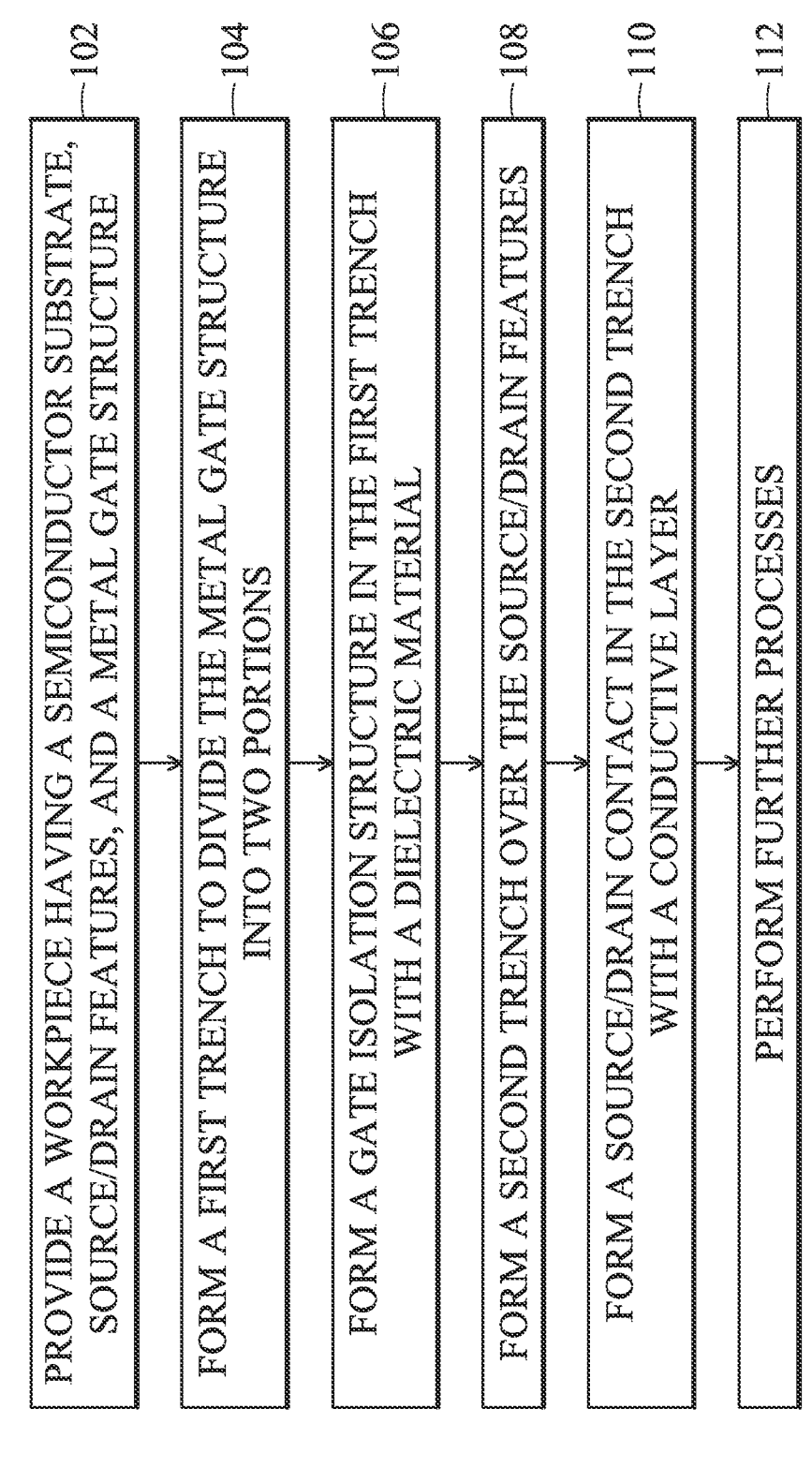

100

PROVIDE A WORKPIECE HAVING A SEMICONDUCTOR SUBSTRATE, SOURCE/DRAIN FEATURES, AND A METAL GATE STRUCTURE — 102

FORM A FIRST TRENCH TO DIVIDE THE METAL GATE STRUCTURE INTO TWO PORTIONS — 104

FORM A GATE ISOLATION STRUCTURE IN THE FIRST TRENCH WITH A DIELECTRIC MATERIAL — 106

FORM A SECOND TRENCH OVER THE SOURCE/DRAIN FEATURES — 108

FORM A SOURCE/DRAIN CONTACT IN THE SECOND TRENCH WITH A CONDUCTIVE LAYER — 110

PERFORM FURTHER PROCESSES — 112

SOURCE/DRAIN CONTACTS AND METHODS FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As integrated circuit (IC) technologies progress towards smaller technology nodes, electrical short may exist between adjacent metal gates and source/drain contacts disposed over source/drain features. This may impact the overall performance of an IC device. While existing source/drain contacts are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure, according to one or more aspects of the present disclosure.

FIGS. 2A, 3A, 4A, 5A, and 6A illustrate fragmentary top views of an exemplary workpiece during various fabrication stages in the method of FIG. 1, according to various aspects of the present disclosure.

FIGS. 2B, 3B, 4B, 5B, and 6B illustrate fragmentary cross-sectional views of the workpiece during various fabrication stages in the method of FIG. 1 along line B-B' of FIGS. 2A, 3A, 4A, 5A, and 6A, respectively, according to various aspects of the present disclosure.

FIGS. 2C, 3C, 4C, 5C, and 6C illustrate fragmentary cross-sectional views of the workpiece during various fabrication stages in the method of FIG. 1 along line C-C' of FIGS. 2A, 3A, 4A, 5A, and 6A, respectively, according to various aspects of the present disclosure.

FIGS. 5D and 6D illustrate enlarged fragmentary top views of portions of the workpiece during various fabrication stages in the method of FIG. 1, according to various aspects of the present disclosure.

DETAILED DESCRIPTION

Figures 2A, 2B:
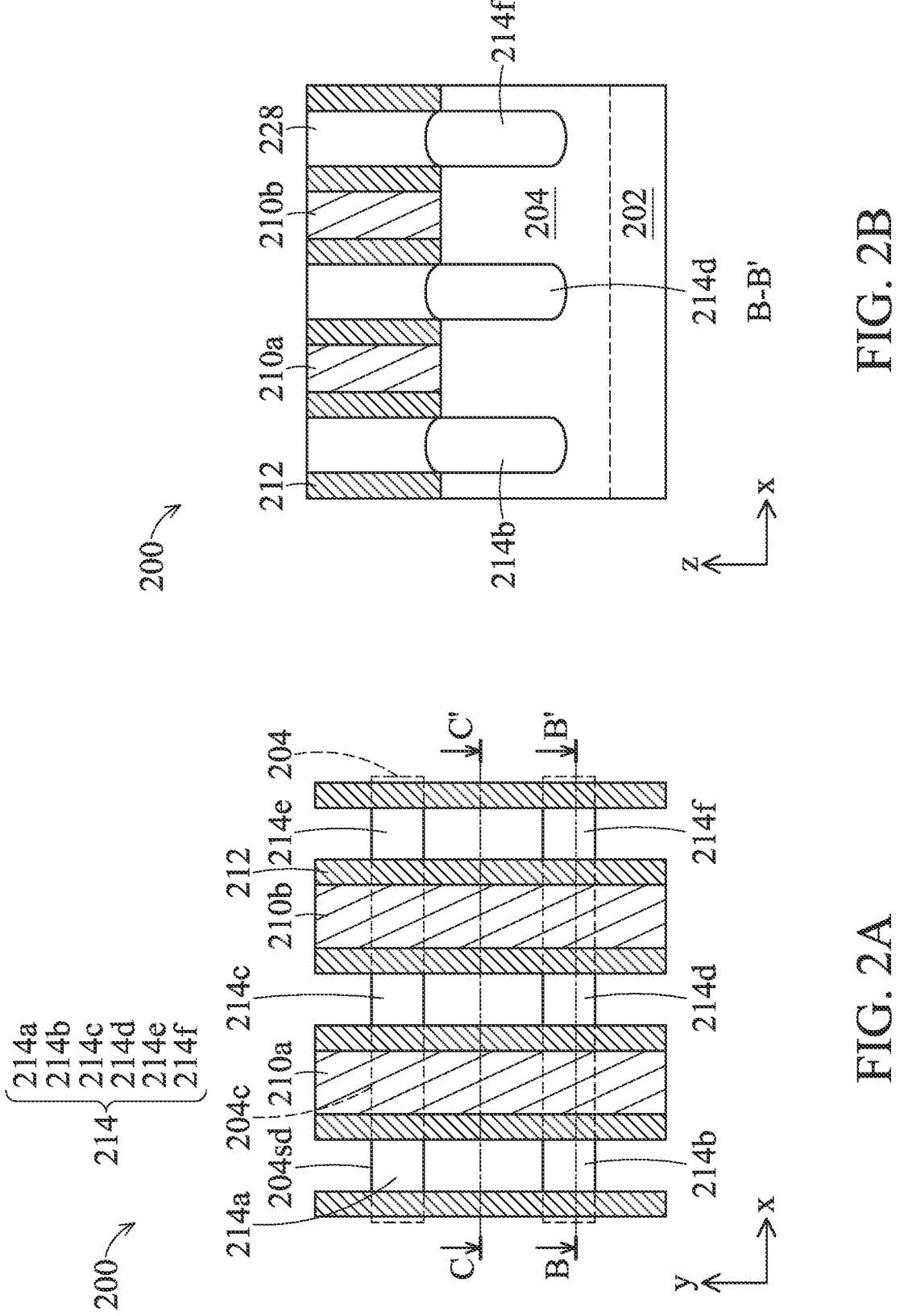

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

As integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a metal gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A Fin-FET has an elevated channel wrapped by a gate on more than one side (for example, the gate wraps a top and sidewalls of a "fin" of semiconductor material extending from a substrate). An MBC transistor has a metal gate structure that can extend, partially or fully, around a channel region to provide access to the channel region on two or more sides. Because its metal gate structure surrounds the channel region, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Variants of MBC transistors, such as those referred to as fish-bone structures or forksheet structures, have been proposed to reduce cell dimensions. In a forksheet structure, adjacent stacks of channel members may be divided by a dielectric wall (also referred to as a dielectric fin). The dielectric wall usually has a height substantially equal to or greater than that of the topmost channel members or that of the source/drain features. Complementary metal-oxide-semiconductor field effect transistors (CMOSFETs or CFETs) have dominated the semiconductor industry due to their high noise immunity and low static power consumption. A CFET includes an n-type FET (NFET) and a p-type FET (PFET) disposed side-by-side on the same substrate and the NFET and PFET share the same structure. In some embodiments, NFET and the PFET are both planar devices, both FinFETs, or both MBC transistors.

A semiconductor structure may have isolation features between segments of a metal gate structure, which are referred to as gate isolation structures or gate-cut structures. In one example, the metal gate structure may be cut into two or more portions and subsequently separated by gate isolation structure(s) in a process referred to as cut metal gate (CMG). The gate isolation structures are oriented lengthwise in a direction generally perpendicular to the direction of the metal gate structure. The gate isolation structures are formed by patterning process to form trenches and deposition to fill in the trenches with one or more dielectric materials. The patterning process includes lithography process and etching process and may use hard mask to define the regions for forming the gate isolation structures.

The semiconductor structure may have source/drain contacts formed over and electrically coupled to one or more source/drain features. An example process for forming a source/drain contact may include forming a source/drain contact opening exposing the source/drain features, and then forming a conductive layer in the source/drain contact opening. However, during the formation of the source/drain contact opening, due to, for example, etch variation, mask overlay of photolithography process, and/or critical dimension uniformity (CDU) limitations, the source/drain contact opening may be enlarged and/or shifted, leading to electrical short between the segments of the metal gate structure and the source/drain contact formed in the source/drain contact opening.

The present disclosure provides semiconductor structures and methods of forming the same. In an embodiment, a semiconductor structure includes a source/drain contact having a first portion disposed directly above the source/drain feature and a second portion disposed directly over an isolation feature and adjacent to a gate isolation structure. In an exemplary embodiment, to reduce or avoid electrical short between segments of the metal gate structure (e.g., a metal gate structure cut by the gate isolation structure) and the source/drain contact, the second portion of the source/drain contact has a reduced width compared to its first portion. In some embodiments, the second portion of the source/drain contact also has a reduced depth compared to the first portion of the source/drain contact.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2A-6D, which are fragmentary top or cross-sectional views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor structure upon conclusion of the fabrication processes, the workpiece 200 may be referred to as the semiconductor structure 200 as the context requires. FIGS. 7A-13B are fragmentary top or cross-sectional views of workpieces 300, 400, 500, 600, 700, 800, and 900, respectively, according to various alternative aspects of the present disclosure. The workpieces 300, 400, 500, 600, 700, 800, and 900 may be referred to as semiconductor structures 300, 400, 500, 600, 700, 800, and 900, respectively. For avoidance of doubts, the X, Y and Z directions in FIGS. 2A-13B are perpendicular to one another and are used consistently throughout the present disclosure. Throughout the present disclosure, like reference numerals denote like features unless otherwise excepted.

Figures 2C, 3A:
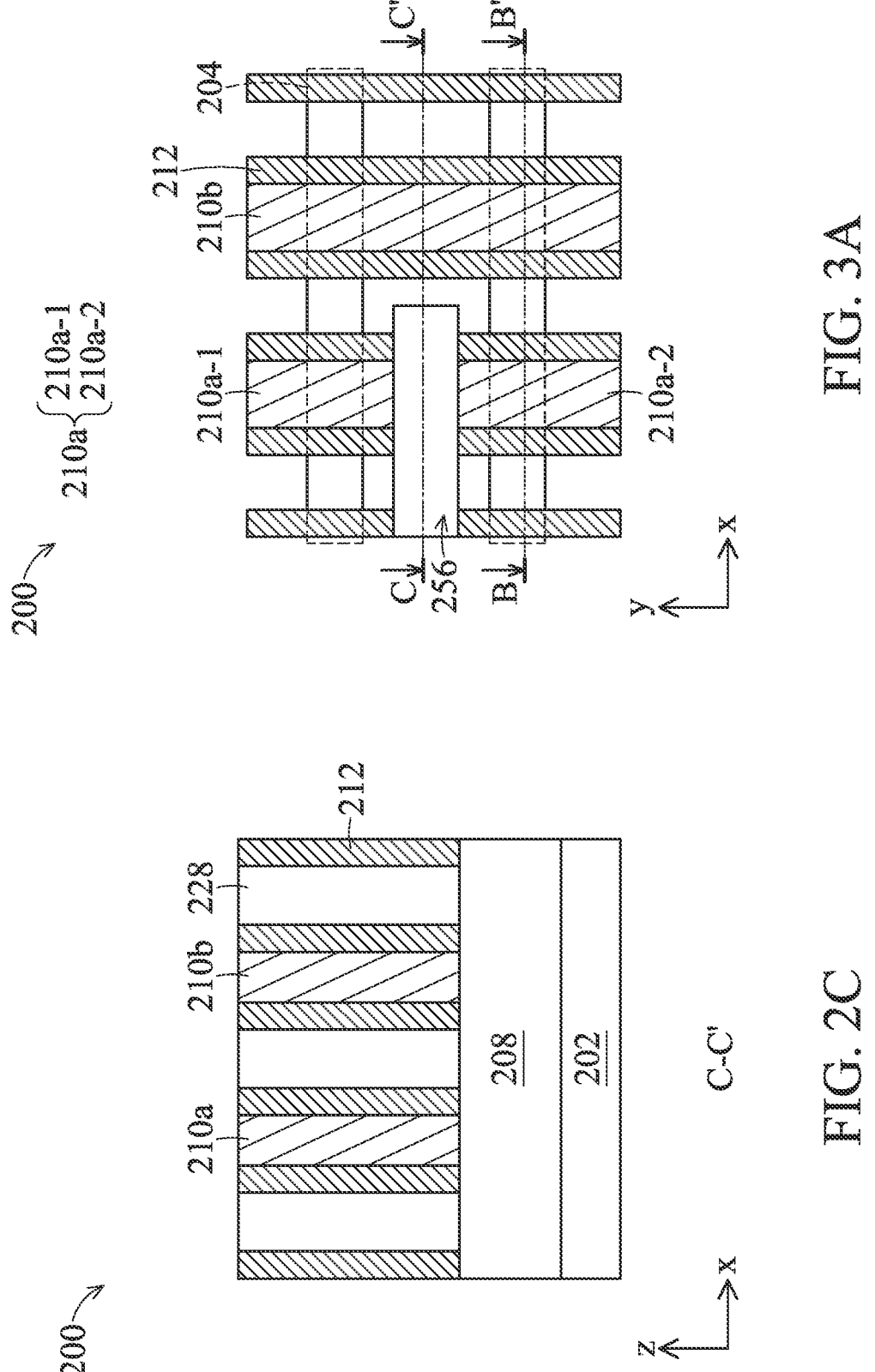

Referring to FIGS. 1 and 2A-2C, method 100 includes a block 102 where the workpiece 200 is received. FIG. 2A depicts a fragmentary top view of the workpiece 200 to undergo various stages of operations in the method of FIG. 1, according to various aspects of the present disclosure. FIGS. 2B and 2C illustrate fragmentary cross-sectional views of the workpiece 200 taken along line B-B' and line C-C' as shown in FIG. 2A, respectively.

As illustrated in FIGS. 2A-2C, the workpiece 200 includes a substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In embodiments, the workpiece 200 includes a number of active regions 204 (e.g., fin-shaped active regions). As depicted in FIG. 2A, each of the active regions 204 extends lengthwise along the X direction and is divided into channel regions 204c overlapped by metal gate structures 210a and 210b (to be described below) and source/drain regions 204sd not overlapped by the metal gate structures 210a and 210b. Source/drain region(s) 204sd may refer to a source region or a drain region, individually or collectively dependent upon the context. The number of active regions 204 and the number of metal gate structures 210a and 210b shown in FIG. 2A are for illustration purpose only and should not be construed as limiting the scope of the present disclosure. In the depicted embodiments, the active regions 204 are disposed over the substrate 202. In embodiments where the workpiece 200 includes FinFETs, the active regions 204 may be formed of a single semiconductor element (e.g., Si). In embodiments where the workpiece 200 includes MBC transistors, the active regions 204 include one or more nanostructures (e.g., a number of channel layers wrapped around by the metal gate structure 210a/210b). Each of the nanostructures may be formed of silicon (Si).

In the present embodiments, the workpiece 200 also includes an isolation feature 208 (shown in FIG. 2C) formed around each active region 204 to isolate two adjacent active regions 204. The isolation feature 208 may also be referred to as a shallow trench isolation (STI) feature and may include silicon oxide, silicon oxynitride, fluorine-doped silicate glass (FSG), a low-k dielectric, combinations thereof, and/or other suitable materials. In some embodiments, the workpiece 200 includes a dielectric structure 228 (to be described below) disposed over the isolation feature 208 and source/drain features 214a-214f (to be described below).

In embodiments, the workpiece 200 includes the metal gate structures 210a and 210b disposed over the channel regions 204c of the active regions 204 and extend lengthwise along the Y direction, such that the metal gate structure 210a has a first portion interposing the source/drain features 214a and 214c and a second portion interposing the source/drain features 214b and 214d, and the metal gate structure 210b has a first portion interposing the source/drain features 214c and 214e and a second portion interposing the source/drain features 214d and 214f. The metal gate structures 210a and 210b each includes a high-k dielectric layer (i.e., having a dielectric constant greater than that of silicon oxide, which is about 3.9; not depicted) disposed over the active regions 204 and a metal gate electrode (not depicted) disposed over the high-k dielectric layer. The metal gate electrode may further include at least one work function metal layer disposed over the high-k dielectric layer and a bulk conductive layer disposed thereover. The work function metal layer may be a p-type or an n-type work function metal layer. Example work function materials include TiN, TaN, WN, ZrSi$_2$, MoSi$_2$, TaSi$_2$, NiSi$_2$, Ti, TaAl, TaAlC, TiAlN, TaC, TaCN, TaSiN, other suitable work function materials, or combinations thereof. The bulk conductive layer may include copper (Cu), tungsten (W), aluminum (Al), cobalt (Co), other suitable materials, or combinations thereof. The metal gate structures 210a and 210b may further include numerous other layers (not depicted), such as an interfacial layer disposed between the active regions 204 and the high-k dielectric layer, hard mask layers, capping layers, barrier layers, other suitable layers, or combinations thereof. Various layers of the metal gate structures 210a and 210b may be deposited by any suitable method, such as chemical oxidation, thermal oxidation, atomic layer deposition (ALD), CVD, physical vapor deposition (PVD), plating, other suitable methods, or combinations thereof. A polishing process, such as a chemical mechanical planarization/polishing (CMP) process, may be performed to remove excess materials from a top surface of the metal gate structures 210a and 210b to planarize a top surface of the workpiece 200.

In some embodiments, the metal gate structures 210a and 210b are formed after other components of the workpiece 200 (e.g., the source/drain features 214a-214f) are fabricated. Such process is generally referred to as a gate replacement process, which includes forming dummy gate structures (not depicted) as a placeholder for the metal gate structures 210a and 210b, forming the source/drain features 214a-214f, forming the dielectric structure 228 over the dummy gate structures and the source/drain features 214a-214f, planarizing the dielectric structure 228 by, for example, CMP, to expose top surfaces of the dummy gate structures, removing the dummy gate structures in the dielectric structure 228 to form trenches that expose the channel regions 204c of the active regions 204, and forming the metal gate structures 210a and 210b in the trenches to complete the gate replacement process.

In some embodiments, the dielectric structure 228 may include a contact etch-stop layer (CESL) and an interlayer dielectric (ILD) layer formed over the CESL. The ILD layer includes a dielectric material, such as tetraethylorthosilicate (TEOS), silicon oxide, a low-k dielectric material, doped silicon oxide such as borophosphosilicate glass (BPSG), phosphosilicate glass (PSG), FSG, boron doped silicate glass (BSG), other suitable dielectric materials, or combinations thereof. The ILD layer may include a multi-layer structure having multiple dielectric materials and may be formed by a deposition process such as, for example, CVD, FCVD, SOG, other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof. The ILD layer may be deposited after the deposition of the CESL.

In some embodiments, the workpiece 200 includes the source/drain features 214a-214f formed in and/or over the source/drain regions 204sd of the active regions 204, each being disposed adjacent to the metal gate structures 210a and 210b. The source/drain features 214a-214f can be separately or collectively referred to as source/drain feature(s) 214. The source/drain features 214a-214f may be formed by any suitable techniques, such as etching processes followed by one or more epitaxial growth processes. In one example, one or more etching processes are performed to remove portions of the active regions 204 to form recesses (not shown) in the source/drain regions 204sd. A cleaning process may be performed to clean the recesses with a hydrofluoric acid (HF) solution or other suitable solution. Subsequently, one or more epitaxial growth processes are performed to grow epitaxial source/drain features in the recesses. Each of the source/drain features 214a-214f may be suitable for forming a p-type FinFET device or alternatively, an n-type FinFET device. The p-type source/drain features may include one or more epitaxial layers of silicon germanium (epi SiGe) doped with a p-type dopant such as boron, germanium, indium, and/or other p-type dopants. The n-type source/drain features may include one or more epitaxial layers of silicon (epi Si) or silicon carbon (epi SiC) doped with an n-type dopant such as arsenic, phosphorus, and/or other n-type dopant.

In embodiments, the workpiece 200 further includes gate spacers 212 disposed on sidewalls of the metal gate structures 210a and 210b. The gate spacers 212 may include a dielectric material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride (SiN), zirconium nitride, silicon carbonitride, etc.), a silicon-containing material (e.g., hafnium silicide, silicon, zirconium silicide, etc.), other suitable materials, or combinations thereof. The gate spacers 212 may be a single layered structure or a multi-layered structure. Notably, the composition of the gate spacers 212 is distinct from that of the surrounding dielectric components, such that an etching selectivity may exist between the gate spacers 212 and the surrounding dielectric components during subsequent etching processes. In an embodiment, the gate spacers 212 include SiN. The gate spacers 212 may be formed by first depositing a blanket of spacer material over the workpiece 200, and then performing an anisotropic etching process to remove portions of the spacer material to form the gate spacers 212.

Figures 3B, 3C:
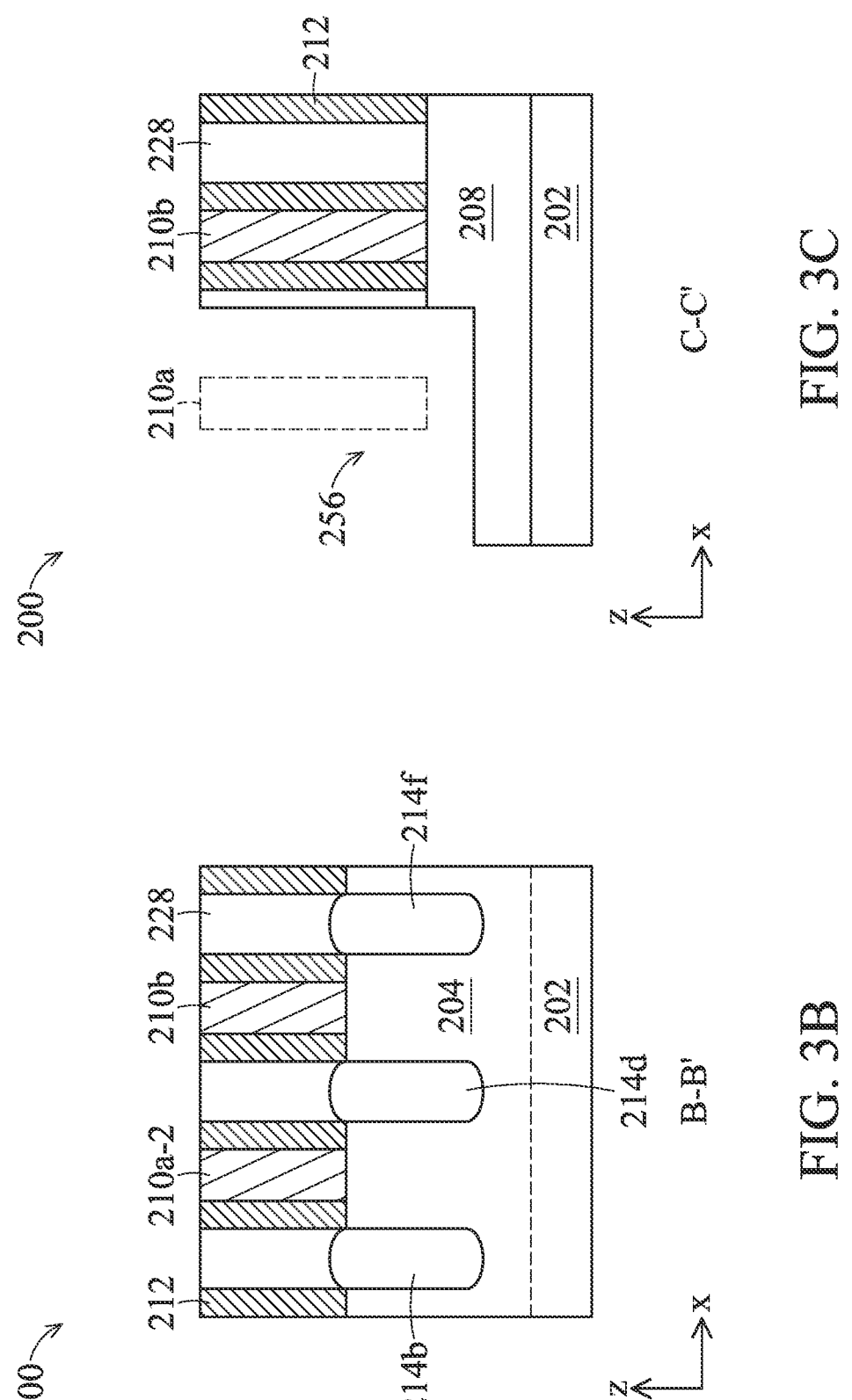

Referring to FIGS. 1 and 3A-3C, method 100 includes a block 104 where a gate isolation trench 256 is formed to divide the metal gate structure 210a into two portions. FIG. 3A depicts a fragmentary top view of the workpiece 200, FIGS. 3B and 3C illustrate fragmentary cross-sectional views of the workpiece 200 taken along line B-B' and line C-C' as shown in FIG. 3A, respectively. In some embodiments, the gate isolation trench 256 extends lengthwise along the X direction from a top view.

The forming of the gate isolation trench 256 may use any suitable methods. In an embodiment, photolithography process(es) and etching process(es) are performed to the workpiece 200 to form the gate isolation trench 256. Portions of the metal gate structure 210a, the gate spacers 212, the dielectric structure 228, and/or the isolation feature 208 are removed to form the gate isolation trench 256. The etching process(es) may include wet etch, dry etch, or a combination thereof and etch through the conductive materials of the metal gate structure 210a. The etching process(es) may use one or more etchant. In some implementations, the gate isolation trench 256 includes tapered sidewalls. In the present embodiments, the gate isolation trench 256 extends through the metal gate structure 210a and extends downward into the isolation feature 208 as shown in FIG. 3C. In some other implementations, the etching may stop at a top surface of the isolation feature 208. The formation of the gate isolation trench 256 cuts the metal gate structure 210a into a first portion 210a-1 and a second portion 210a-2 (also referred to as a first metal gate structure 210a-1 and a second metal gate structure 210a-2, respectively). The first portion 210a-1 and the second portion 210a-2 may also be collectively referred to as the metal gate structure 210a. Dashed rectangle shown in FIG. 3C is the metal gate structure 210a projected on the cross-sectional view across line C-C'.

Figures 4A, 4B:
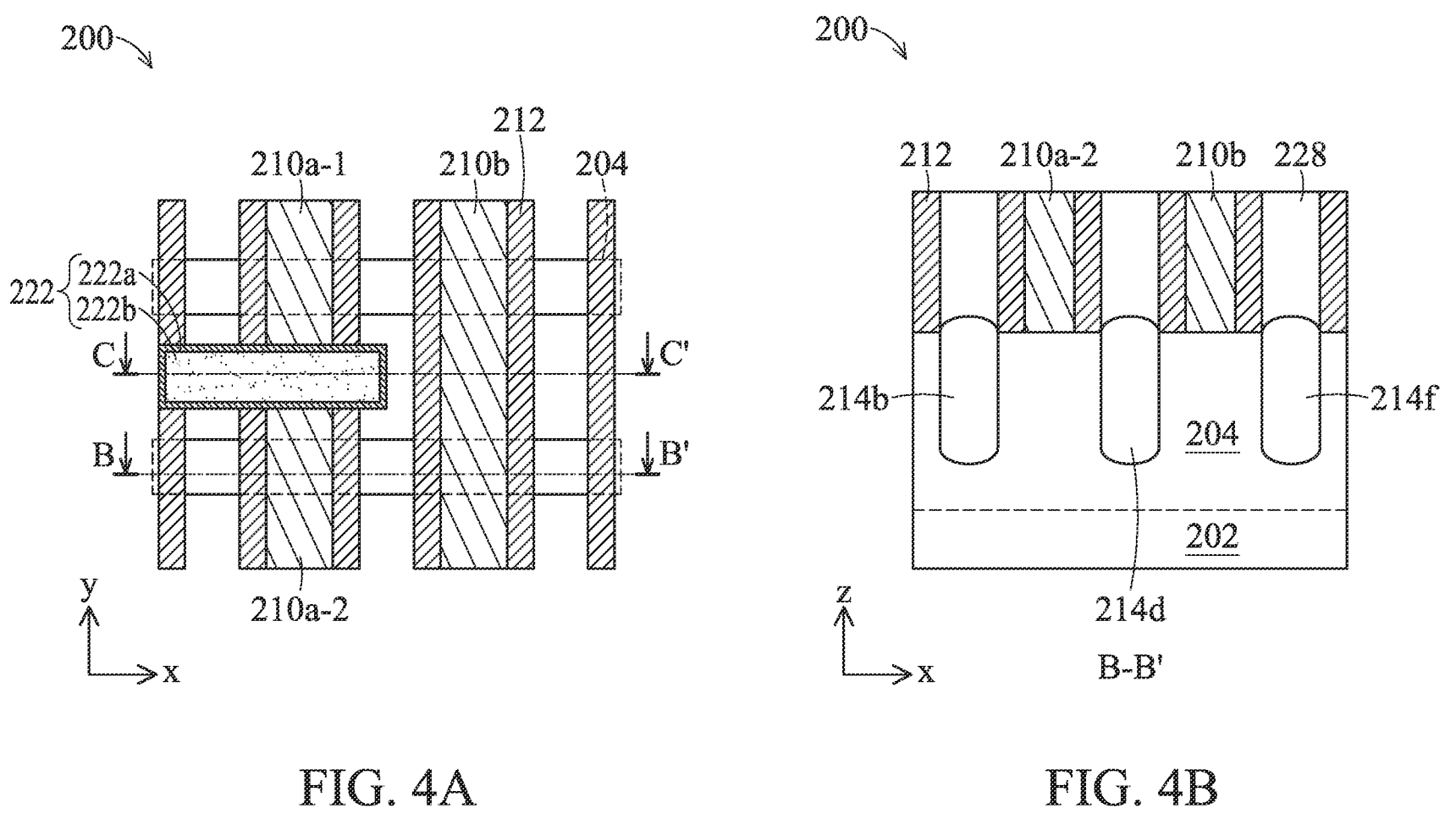
Figures 4C, 5A:
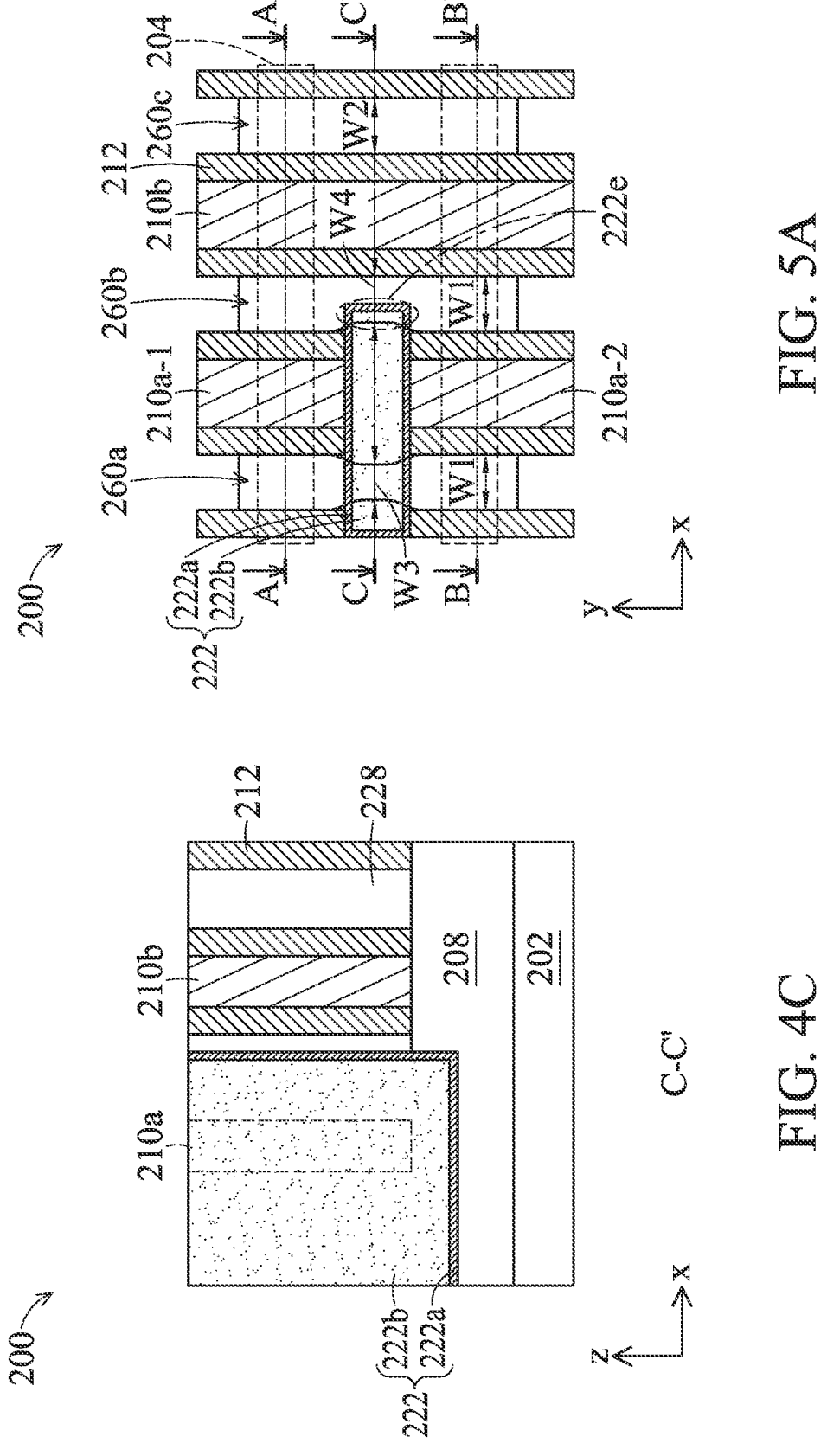

Referring to FIGS. 1 and 4A-4C, method 100 includes a block 106 where a gate isolation structure 222 is formed in the gate isolation trench 256. FIG. 4A depicts a fragmentary top view of the workpiece 200, FIGS. 4B and 4C illustrate fragmentary cross-sectional views of the workpiece 200 taken along line B-B' and line C-C' as shown in FIG. 4A, respectively. The gate isolation structure 222 cuts/divides the metal gate structure 210a electrically and physically into two isolated portions (e.g., the first portion 210a-1 and the second portion 210a-2).

The gate isolation structure 222 may cut and thus be in direct contact with the metal gate electrode of the metal gate structures 210a-1 and 210a-2. In an embodiment, the gate isolation structure 222 extends into the isolation feature 208. In some embodiments, the gate isolation structure 222 includes multiple layers, such as a first dielectric layer 222a and a second dielectric layer 222b embedded in the first dielectric layer 222a. The formation of the gate isolation structure 222 may include conformally depositing the first dielectric layer 222a over the workpiece 200, depositing the second dielectric layer 222b over the first dielectric layer 222a to fill a remaining portion of the gate isolation trench 256, and performing a planarization process to the workpiece 200 to remove excess portions of the first and the second dielectric layers 222a and 222b over the metal gate structures 210a and 210b and define a final structure of the gate isolation structure 222. The term "conformally" may be used herein for ease of description of a layer having substantially uniform thickness over various regions of the workpiece 200. In embodiments, the first dielectric layer 222a includes silicon nitride (SiN) and may be deposited by atomic layer deposition (ALD), chemical vapor deposition (CVD), or any other suitable deposition process. In an embodiment, the first dielectric layer 222a includes silicon nitride. In some embodiments, the second dielectric layer 222b includes a high-k dielectric material, a low-k dielectric material, other suitable materials, or combinations thereof. Example materials of the second dielectric layer 222b include silicon oxide (SiO and $SiO_2$), silicon nitride, silicon carbide (SiC), silicon oxynitride (SiON), silicon oxycarbide (SiOC), silicon carbonitride (SiCN), silicon oxycarbonitride (SiCON), aluminum oxide, zirconium silicate ($ZrSiO_4$), and hafnium silicate ($HfSiO_4$). In some embodiments, the second dielectric layer 222b includes silicon oxide. The second dielectric layer 222b may be deposited by CVD, PECVD, flowable CVD, PVD, ALD, other suitable methods, or combinations thereof. In an embodiment, the second dielectric layer 222b includes silicon oxide. In some embodiments, the gate isolation structure 222 may be a single-layer structure. In some embodiments, the gate isolation structure 222 and the gate spacers 212 include different dielectric materials. In embodiments, the gate spacers 212 include a dielectric material having a dielectric constant greater than a dielectric material of the gate isolation structure 222. In an embodiment, the gate spacers 212 include silicon nitride and the gate isolation structure 222 includes silicon oxide.

Figures 5B, 5C:
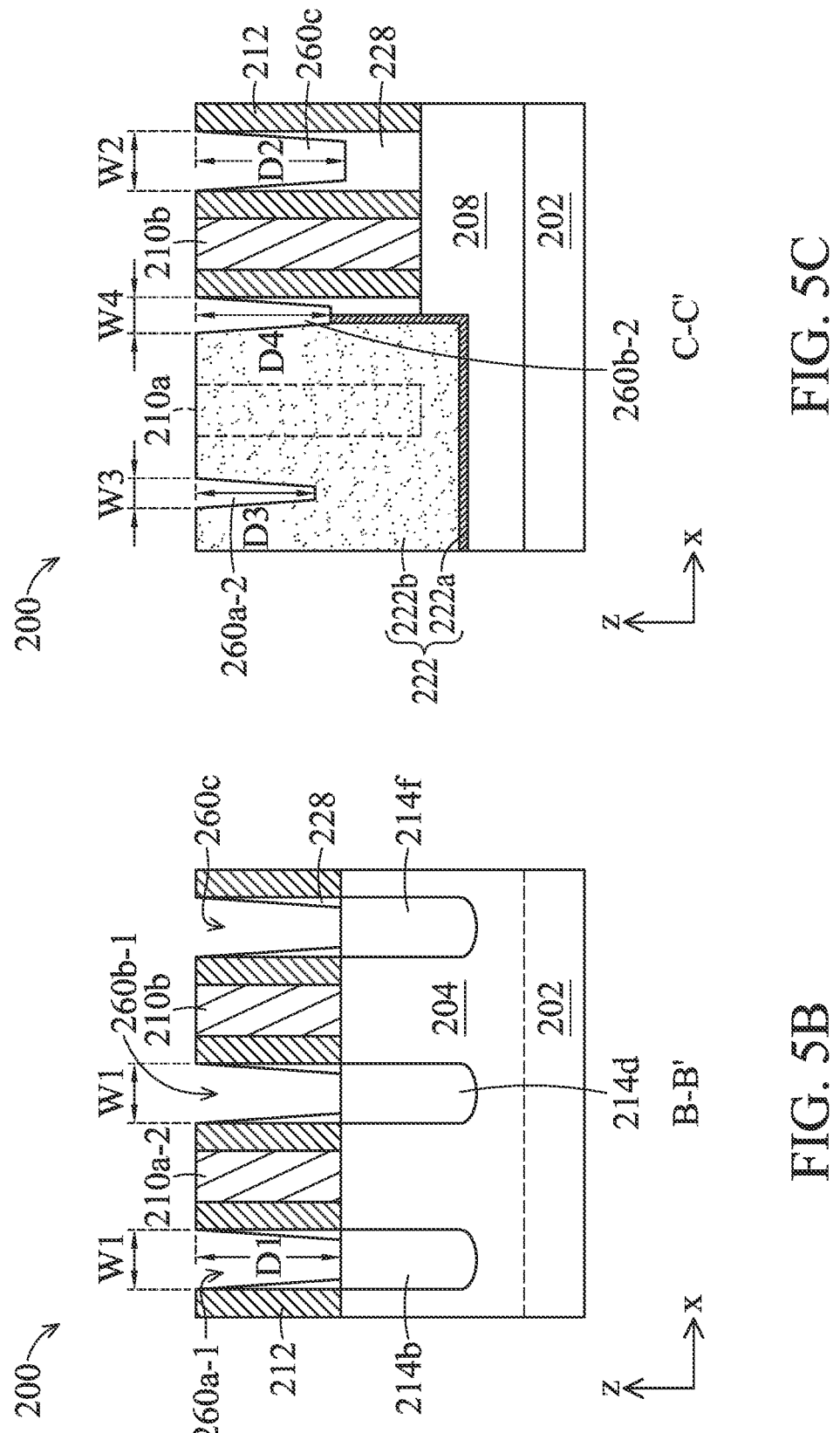
Figure 5D:
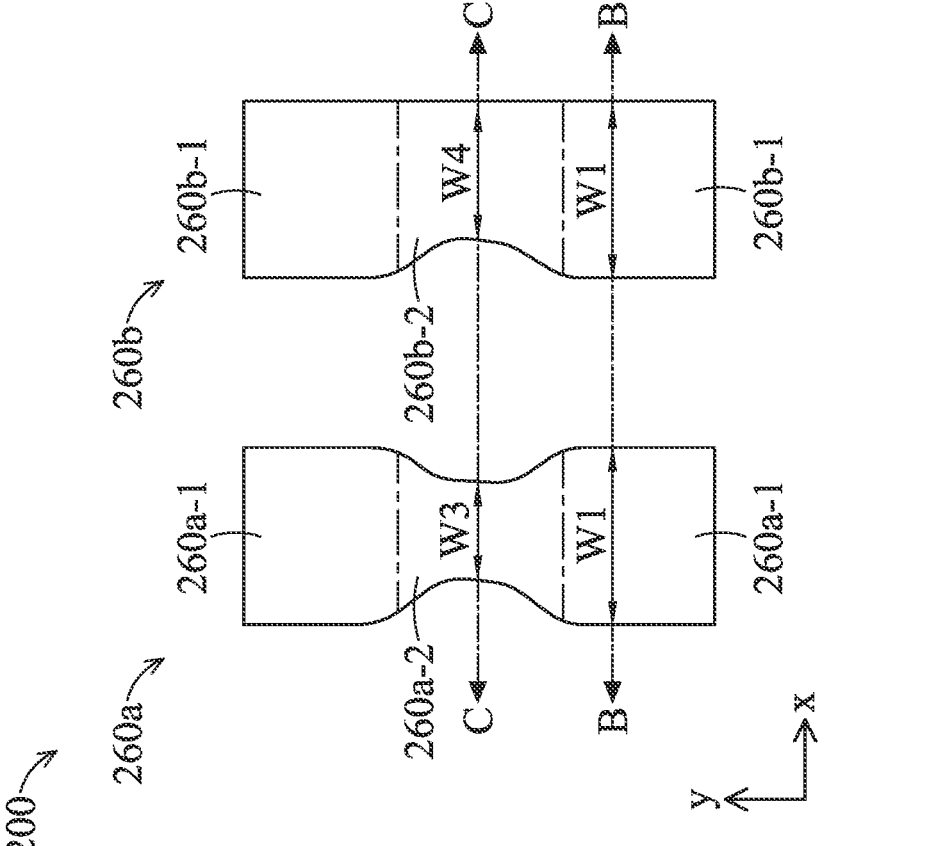

Referring to FIGS. 1 and 5A-5D, method 100 includes a block 108 where a trench (e.g., trench 260a, 260b, and/or 260c) is formed to expose the source/drain features 214. FIG. 5A depicts a fragmentary top view of the workpiece 200, FIGS. 5B and 5C illustrate fragmentary cross-sectional views of the workpiece 200 taken along line B-B' and line C-C' as shown in FIG. 5A, respectively, FIG. 5D illustrates enlarged top views of the trenches 260*a* and 260*b*.

In this step, to form the trench 260*a* or 260*b*, portions of the dielectric structure 228 and portions of the gate isolation structure 222 are removed to expose the source/drain features 214 using a combination of photolithography process (es) and etch process(es), such as dry etching, wet etching, and/or reactive ion etching (RIE)). In an example process, a hard mask layer and a photoresist are deposited over the workpiece 200. The photoresist layer is then exposed to a patterned radiation transmitting through or reflected from a photo mask, baked in a post-exposure bake process, developed in a developer solution, and then rinsed, thereby forming a patterned photoresist layer. The patterned photoresist layer is then applied as an etch mask to etch the hard mask layer to form a patterned hard mask layer. The patterned hard mask layer is then applied as an etch mask to etch the dielectric structure 228 and the gate isolation structure 222. The etch process may be a dry etch process that includes use of argon (Ar), a fluorine-containing etchant (for example, $SF_6$, $NF_3$, $CH_2F_2$, $CHF_3$, $C_4F_8$, and/or $C_2F_6$), an oxygen-containing etchant, a chlorine-containing etchant (for example, $Cl_2$, $CHCl_3$, $CCl_4$, and/or $BCl_3$), a bromine-containing etchant (for example, HBr and/or $CHBr_3$), an iodine-containing etchant, oxygen, hydrogen, other suitable gases, or combinations thereof.

In the present embodiments, a cross-sectional view of the workpiece 200 taken along line A-A' shown in FIG. 5A is substantially identical to the cross-sectional view of the workpiece 200 taken along line B-B'. Accordingly, the cross-sectional view of the workpiece 200 taken along line A-A' is omitted in the description of subsequent processing stages. A person skilled in the art understands that cross-sectional view of the workpiece 200 taken along line A-A' at those processing stages substantially mirrors those depicted for the cross-sectional view of the workpiece 200 taken along line B-B'. Although three trenches 260*a*-260*c* are depicted, it is understood that the workpiece 200 may include any combination and number of the trenches 260*a*-260*c* in various relative positions. For example, depending on the position of the gate isolation structure 222, a workpiece may include a trench 260*a* exposing the source/drain features 214*c* and 214*d* and a trench 260*c* exposing the source/drain features 214*c* and 214*f*. In the present embodiments, the trenches 260*a*, 260*b*, and 260*c* include tapered sidewalls. In some other implementations, the trenches 260*a*, 260*b*, and 260*c* may include substantially vertical sidewalls.

In some embodiments, each of the trenches 260*a*-260*c* are formed to penetrate into the dielectric structure 228 and/or into the gate isolation structure 222. More specifically, in some embodiments, the gate isolation structure 222 and the trench 260*a* cross over each other from a top view as shown in FIG. 5A. The trench 260*a* includes two first portions 260*a*-1 and a second portion 260*a*-2 spanning between the two first portions 260*a*-1. The two first portions 260*a*-1 and the second portion 260*a*-2 are divided by dashed lines in FIG. 5D. The two first portions 260*a*-1 expose the source/drain features 214*a* and 214*b*, respectively. In embodiments, the second portion 260*a*-2 does not have an overlap with the metal gate structure 210*a* projected on the cross-sectional view across line C-C'. The trench 260*a* has a shape having a non-uniform width along its length from a top view. In an embodiment, the two first portions 260*a*-1 span a width W1 along the X direction and a depth D1 along the Z direction. The width W1 may be substantially the same as or smaller than a distance between adjacent gate spacers 212 on two sides of each of the trenches 260*a*, 260*b*, and 260*c*. In some embodiments, the second portion 260*a*-2 spans a width W3 along the X direction and a depth D3 along the Z direction. The width W1 is greater than the width W3. In an embodiment, a ratio of the width W3 to the width W1 (i.e., W3/W1) is in a range of about 0.5 to about 0.95. If W3/W1 is too small, contact resistance between the source/drain contact (e.g., the source/drain contact 218*a*, to be described below) to be formed in the trench 260*a* and the source/drain features (e.g., source/drain features 214*a* and 214*b*) thereunder may be too large. If W3/W1 is too large, the second portion 260*a*-2 may be too close to the adjacent metal gate structures 210*a*-1 and 210*a*-2, electrical short issue between the metal gate structures 210*a*-1 and 210*a*-2 and the source/drain contact 218*a* may persist. In some embodiments, the depth D1 is greater than the depth D3. In an embodiment, a ratio of the depth D3 to the depth D1 is in a range of about 0.3 to about 0.95.

In embodiments, an end 222*e* of the gate isolation structure 222 and the trench 260*b* have an overlap from a top view as shown in FIG. 5A. Similar to the trench 260*a*, the trench 260*b* includes two first portions 260*b*-1 and a second portion 260*b*-2 spanning between the two first portions 260*b*-1. The two first portions 260*b*-1 expose the source/drain features 214*c* and 214*d*, respectively. In some embodiments, referring to FIG. 5C, a portion of the sidewall of the gate spacers 212 is exposed to the second portion 260*b*-2. In embodiments, the second portion 260*b*-2 does not have an overlap with the metal gate structure 210*a* projected on the cross-sectional view across line C-C'. The trench 260*b* has a shape having a non-uniform width along its length from a top view. In an embodiment, the two first portions 260*b*-1 span the width W1 along the X direction and the depth D1 along the Z direction. In some embodiments, as depicted in FIG. 5C, the second portion 260*b*-2 spans a width W4 along the X direction and a depth D4 along the Z direction. The width W1 is greater than the width W4. In an embodiment, a ratio of the width W4 to the width W1 (i.e., W4/W1) is in a range of about 0.7 to about 0.95. If W4/W1 is too small, contact resistance between the source/drain contact (e.g., the source/drain contact 218*b*, to be described below) to be formed in the trench 260*b* and the source/drain features (e.g., source/drain features 214*c* and 214*d*) thereunder may be too large. If W4/W1 is too large, the second portion 260*b*-2 may be too close to the adjacent metal gate structures 210*a*-1 and 210*a*-2, electrical short between the metal gate structures 210*a*-1 and 210*a*-2 and the source/drain contact 218*b* may persist. In some embodiments, the depth D1 is greater than the depth D4. In an embodiment, a ratio of the depth D4 to the depth D1 is in a range of about 0.5 to about 0.95.

In some embodiments, the width W4 is equal to or greater than the width W3. In an embodiment, a ratio of the width W3 to the width W4 (i.e., W3/W4) is in a range of about 0.7 to about 1. If W3/W4 is too small, contact resistance between the source/drain contact 218*a* and the source/drain features (e.g., source/drain features 214*a* and 214*b*) thereunder may be too large, affecting an overall performance of the semiconductor structure or the second portion 260*b*-2 of the trench 260*b* may be too close to the adjacent metal gate structures 210*a*-1 and 210*a*-2, electrical short between the metal gate structures 210*a*-1 and 210*a*-2 and the source/drain contact 218*b* may persist. If the ratio of W3/W4 is too large, contact resistance between the source/drain contact 218*b* and the source/drain features (e.g., source/drain features 214*c* and 214*d*) thereunder may be too large, affecting an overall performance of the semiconductor structure or the second portion 260*a*-2 of the trench 260*a* may be too close to the adjacent metal gate structures 210*a*-1 and 210*a*-2, electrical short between the metal gate structures 210*a*-1 and 210*a*-2 and the source/drain contact 218*a* may persist. In some embodiments, the depth D4 is equal to or greater than the depth D3. In an embodiment, a ratio of the depth D3 to the depth D4 is in a range of about 0.5 to about 1.

In embodiments, the trench 260*c* is spaced apart from the gate isolation structure 222. The trench 260*c* exposes the source/drain features 214*e* and 214*f*. The trench 260*c* has a shape having a substantially uniform width W2 along its length from a top view and a depth D2 along the Z direction. The width W2 is substantially equal to the width W1. The depth D2 is substantially equal to the depth D1.

Figures 6A, 6B:
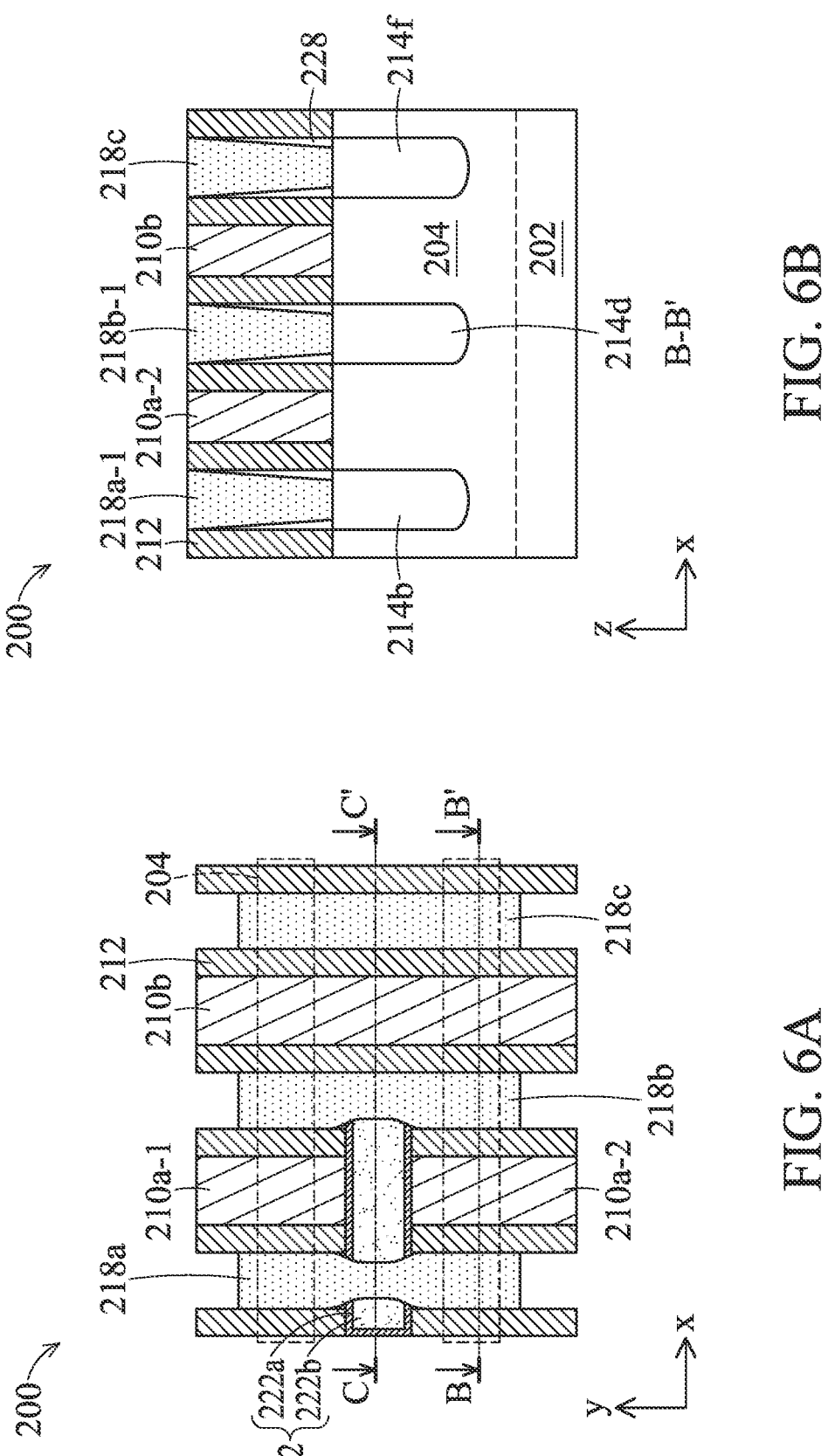
Figures 6C, 6D:
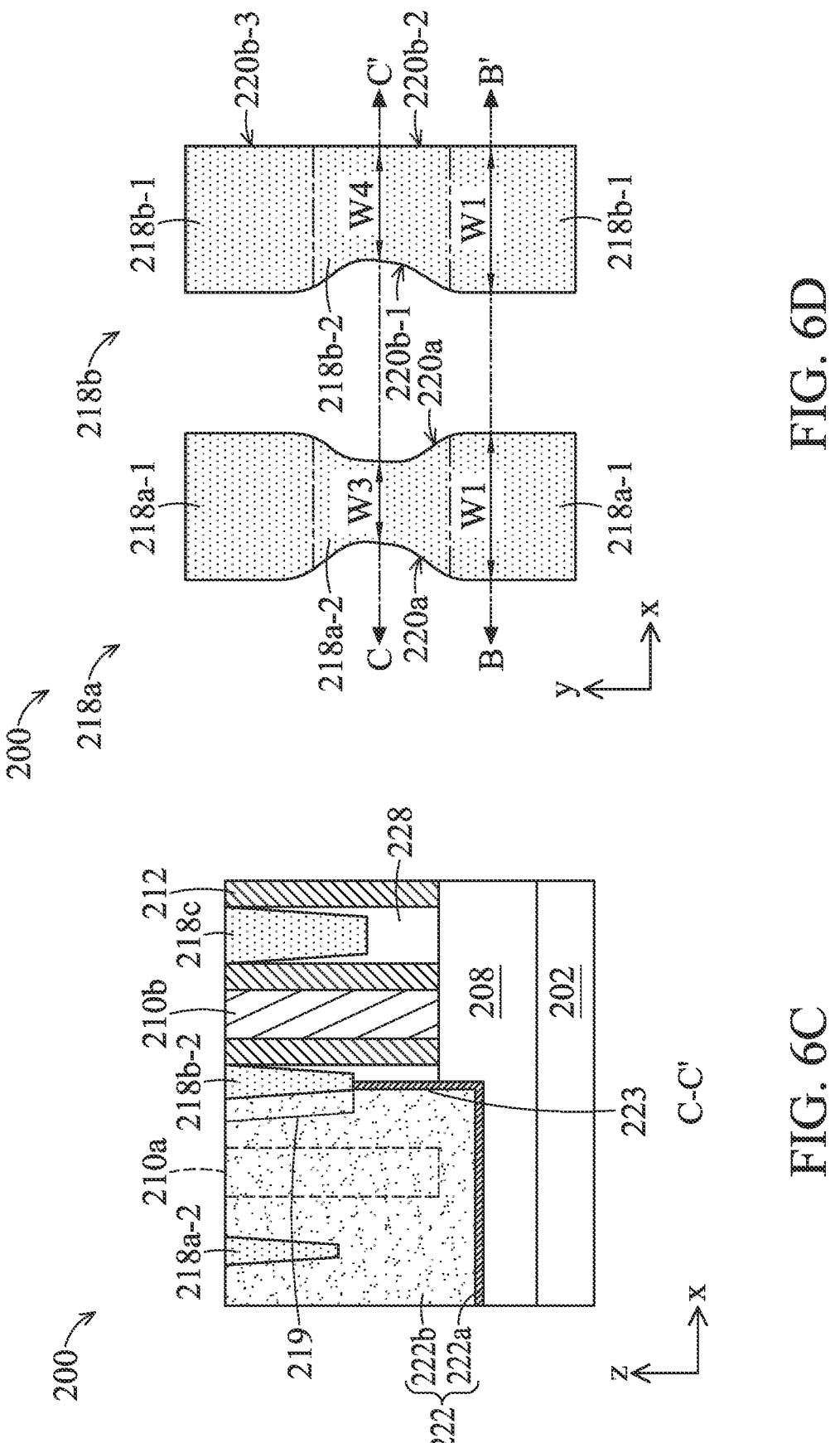

Referring to FIGS. 1 and 6A-6D, method 100 includes a block 110 where source/drain contacts 218*a*, 218*b*, and 218*c* are formed in the trenches 260*a*, 260*b*, and 260*c*, respectively. FIG. 6A depicts a fragmentary top view of the workpiece 200, FIGS. 6B and 6C illustrate fragmentary cross-sectional views of the workpiece 200 taken along line B-B' and line C-C' as shown in FIG. 6A, respectively, FIG. 6D illustrates enlarged top views of the source/drain contacts 218*a* and 218*b*.

Before forming the source/drain contacts 218*a*-218*c*, a silicide layer (not depicted) may be formed over each of the source/drain features 214*a*-214*f*. In some embodiments, the silicide layer includes a metal silicide, such as nickel silicide, cobalt silicide, tungsten silicide, tantalum silicide, titanium silicide, platinum silicide, erbium silicide, palladium silicide, other suitable silicides, or combinations thereof. The silicide layer may be formed by a deposition process such as CVD, ALD, PVD, other suitable processes, or combinations thereof. For example, a metal layer (e.g., nickel) may be deposited over the source/drain features 214*a*-214*f*. Then, the workpiece 200 is annealed to allow the metal layer and the semiconductor materials of the source/drain features 214*a*-214*f* to react. Thereafter, the un-reacted metal layer is removed, leaving the silicide layer over the source/drain features 214*a*-214*f*. Alternatively, the silicide layer may be directly formed over the source/drain features 214*a*-214*f* by any suitable deposition method, such as CVD, ALD, PVD, other suitable methods, or combinations thereof.

Forming the source/drain contacts 218*a*, 218*b*, and 218*c* may include depositing a conductive layer (not depicted) in the trenches 260*a*, 260*b*, and 260*c* and over portions of the metal gate structures 210*a* and 210*b*, the gate spacers 212, and the dielectric structure 228. The conductive layer may include any suitable material, such as W, Co, Ru, Cu, Ta, Ti, Al, Mo, other suitable conductive materials, or combinations thereof. The conductive layer may be deposited by any suitable method, such as CVD, PVD, ALD, plating, other suitable methods, or combinations thereof. Thereafter, the method 100 planarizes the top surface of the workpiece 200 using a suitable method such as CMP to form the source/drain contacts 218*a*, 218*b*, and 218*c* over the source/drain features 214 and in the trenches 260*a*, 260*b*, and 260*c*, respectively, such that a top surface of the conductive layer (i.e., the formed source/drain contacts 218*a*, 218*b*, and 218*c*) is substantially coplanar with top surfaces of the metal gate structures 210*a* and 210*b*. In some embodiments, before the deposition of the conductive layer, a glue layer (not depicted) may be formed over the workpiece 200 to partially fill the trenches 260*a*-260*c*. The glue layer may include TiN, TaN, etc.

The source/drain contacts 218*a*-218*c* track the shapes of the trenches 260*a*-260*c*, respectively. That is, dimensions (e.g., widths, depths) of the source/drain contacts 218*a*, 218*b*, and 218*c* are substantially the same as the trenches 260*a*, 260*b*, and 260*c*, respectively. For example, the first portions 218*a*-1 and 218*b*-1 of the source/drain contacts 218*a* and 218*b* have the depth D1, the second portion 218*a*-2 of the source/drain contact 218*a* has the depth D3, and the second portion 218*b*-2 of the source/drain contact 218*b* has the depth D4. In embodiments, the first portions 218*a*-land 218*b*-1 of the source/drain contacts 218*a* and 218*b* have the width W1, the second portion 218*a*-2 of the source/drain contact 218*a* has the width W3, and the second portion 218*b*-2 of the source/drain contact 218*b* has the width W4. The source/drain contact 218*c* has substantially the same width (i.e., the depth W2) and substantially the same depth (i.e., the depth D2).

In addition, the source/drain contact 218*a* includes two first portions 218*a*-1 directly above and electrically coupled to the source/drain features 214*a* and 214*b*, respectively, and a second portion 218*a*-2 extending between the two first portions 218*a*-1. In embodiments, from a top view, the second portion 218*a*-2 of the source/drain contact 218*a* includes two edges 220*a* (shown in FIG. 6D) curved inward. Referring to FIG. 6C, the second portion 218*a*-2 doesn't overlap with the metal gate structure 210*a* projected on the cross-sectional view across line C-C'. In embodiments, the second portion 218*a*-2 is embedded in the gate isolation structure 222.

The source/drain contact 218*b* includes two first portions 218*b*-1 directly above and electrically coupled to the source/drain features 214*c* and 214*d*, respectively, and a second portion 218*b*-2 extending between the two first portions 218*b*-1. In the depicted embodiment as in FIG. 6D, the second portion 218*b*-2 of the source/drain contact 218*b* includes a first edge 220*b*-1 curved inward. A second edge 220*b*-2 opposite to the first edge 220*b*-1 of the second portion 218*b*-2 of the source/drain contact 218*b* is aligned with an edge 220*b*-3 of the first portions 218*b*-1 of the source/drain contact 218*b* along the Y direction. In other words, from a top view, the first portions 218*b*-1 and the second portion 218*b*-2 of the source/drain contact 218*b* share a continuous edge extending along the Y direction, and the continuous edge is substantially straight. Put differently, there is no significant offset between the second edge 220*b*-2 and the edge 220*b*-3 along the Y direction. A distance between the first edge 220*b*-1 of the second portion 218*b*-2 of the source/drain contact 218*b* and the metal gate structure 210*a* is less than a distance between the second edge 220*b*-2 of the second portion 218*b*-2 of the source/drain contact 218*b* and the metal gate structure 210*a*.

In some embodiments, referring to FIG. 6C, a boundary 223 of the gate isolation structure 222 is directly under the second portion 218*b*-2 of the source/drain contact 218*b*. A bottom surface of the second portion 218*b*-2 is in direct contact with both the gate isolation structure 222 and the dielectric structure 228. In an embodiment, a portion of the dielectric structure 228 is interposed between the second portion 218*b*-2 and the gate spacers 212. In embodiments, the second portion 218*b*-2 is in direct contact with a sidewall of the gate isolation structure 222. In embodiments, the source/drain contact 218*b* doesn't overlap with the metal gate structure 210*a* projected on the cross-sectional view across line C-C'. A region 219 circled by dotted lines around the second portion 218b-2 indicates a region where the source/drain contact 218b may be formed within even if there is, for example, an etch variation, overlay shift, during the formation of the trench 260b. In embodiments, the gate spacers 212 are etched at a slower etching rate than that of the gate isolation structure 222. Thus, during the formation of the trench 260b, the gate isolation structure 222 is etched more than the gate spacers 212. Because the second portion 218b-2 has a width (e.g., width W4) less than that of the two first portions 218b-1, a distance from the second portion 218b-2 to the projected metal gate structure 210a is increased. Thus, even if there are fabrication variations during the formation of the trench 260b, because of the increased distance, the possibility of the second portion 218b-2 being in direct contact with an end of the metal gate structures 210a-1/210a-2 is reduced. Therefore, electrical short between the metal gate structure 210a and the second portion 218b-2 may be avoided. For similar reasons, a distance from the second portion 218a-2 of the source/drain contact 218a to the projected metal gate structure 210a is increased, electrical short between the metal gate structure 210a and the second portion 218a-2 is also eliminated.

Referring back to FIG. 1, method 100 includes a block 112 where further processes are performed to finish the fabrication of the workpiece 200. Such further processes may include forming a multi-layer interconnect (MLI) structure (not depicted) over the workpiece 200. In some embodiments, the MLI structure may include multiple intermetal dielectric (IMD) layers and multiple metal lines or contact vias in each of the IMD layers. In some instances, the IMD layers and the dielectric structure 228 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers.

In the present embodiments, the gate isolation structure 222 is formed after the forming of the metal gate structures 210a and 210b. In some other implementations, the gate isolation structure 222 may be formed before or after forming dummy gate structures. For example, the gate isolation structure 222 may be formed to cut a dummy gate structure into two portions, and the two portions of the dummy gate structure may be then replaced by two metal gate structures (e.g., metal gate structures 210a-1 and 210a-2), respectively.

Figures 7A, 7B:
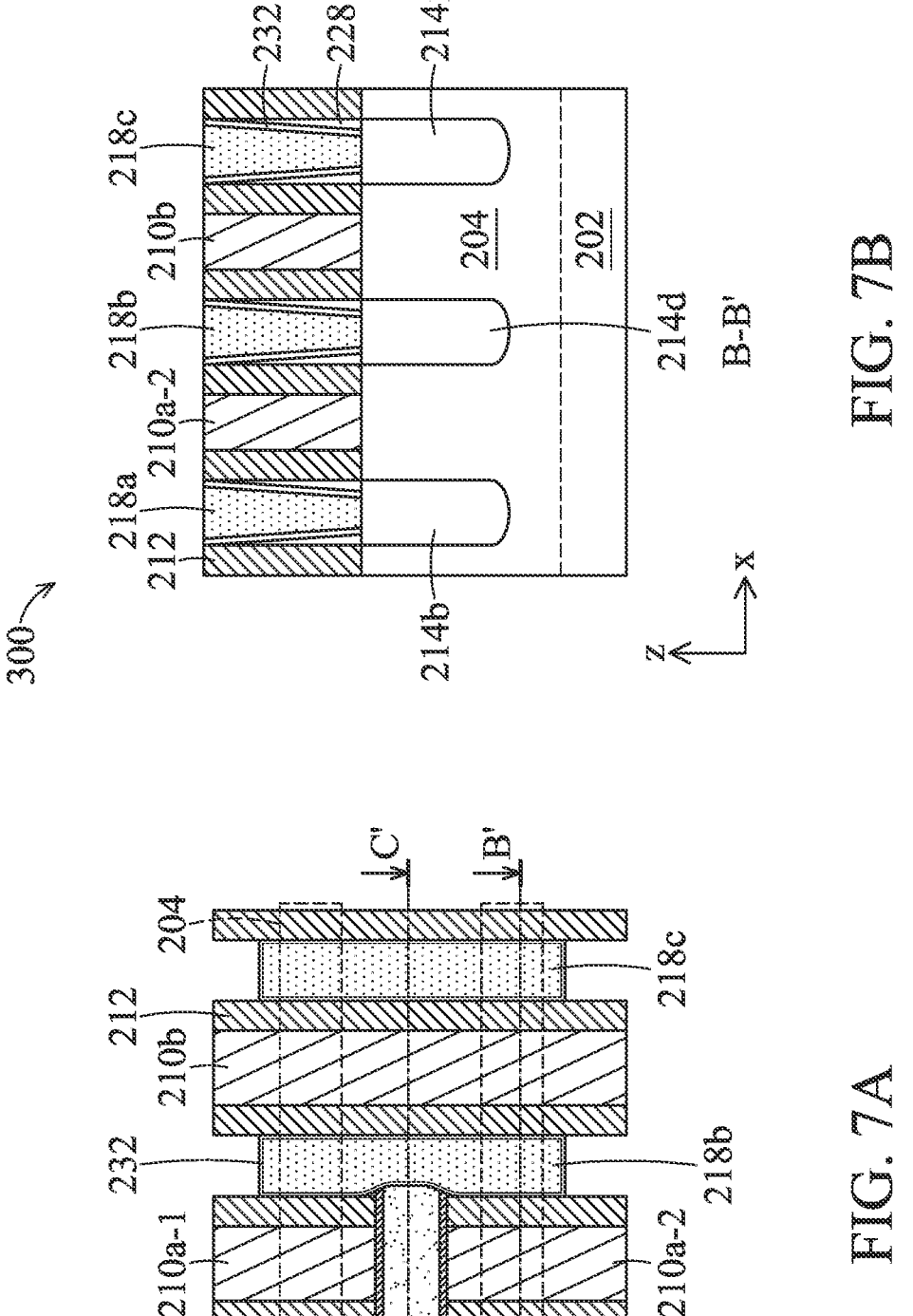
FIG. 7A illustrates a fragmentary top view of a first alternative workpiece, according to various aspects of the present disclosure.
FIGS. 7B and 7C illustrate fragmentary cross-sectional views of the first alternative workpiece taken along line B-B' and line C-C' as shown in FIG. 7A, respectively, according to various aspects of the present disclosure.
Figures 7C, 8A:
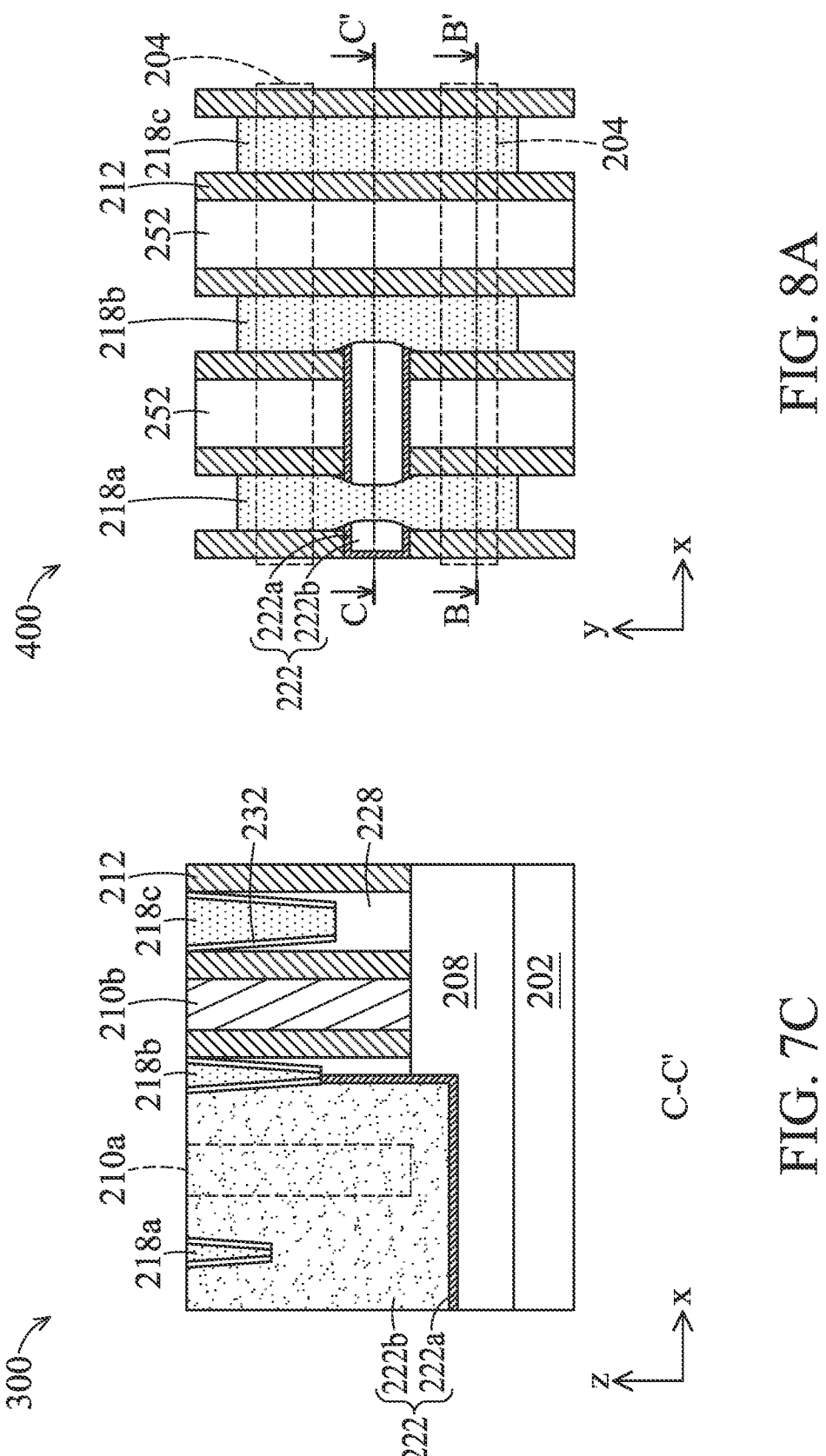
FIG. 8A illustrates a fragmentary top view of a second alternative workpiece, according to various aspects of the present disclosure.

FIG. 7A depicts a fragmentary top view of a first alternative workpiece 300, FIGS. 7B and 7C illustrate fragmentary cross-sectional views of the workpiece 300 taken along line B-B' and line C-C' as shown in FIG. 7A, respectively. The workpiece 300 represented in FIGS. 7A-7C is similar to the workpiece 200 described with reference to FIGS. 6A-6D. One of the differences between the workpiece 300 and the workpiece 200 includes that, in this alternative embodiment, the workpiece 300 includes a dielectric barrier layer 232. More specifically, to prevent diffusion of the conductive layer, after the formation of the trenches 260a-260c, a dielectric barrier layer 232 is formed over the workpiece 300 and then etched back to only cover sidewalls of the trenches 260a-260c and expose the source/drain features 214. The source/drain contacts 218a, 218b, and 218c may then be formed in the trenches 260a-260c. That is, sidewall surfaces of each of the source/drain contacts 218a, 218b, and 218c are lined by the dielectric barrier layer 232 continuously. In some embodiments, the dielectric barrier layer 232 may include silicon nitride or other suitable materials.

Figures 8B, 8C:
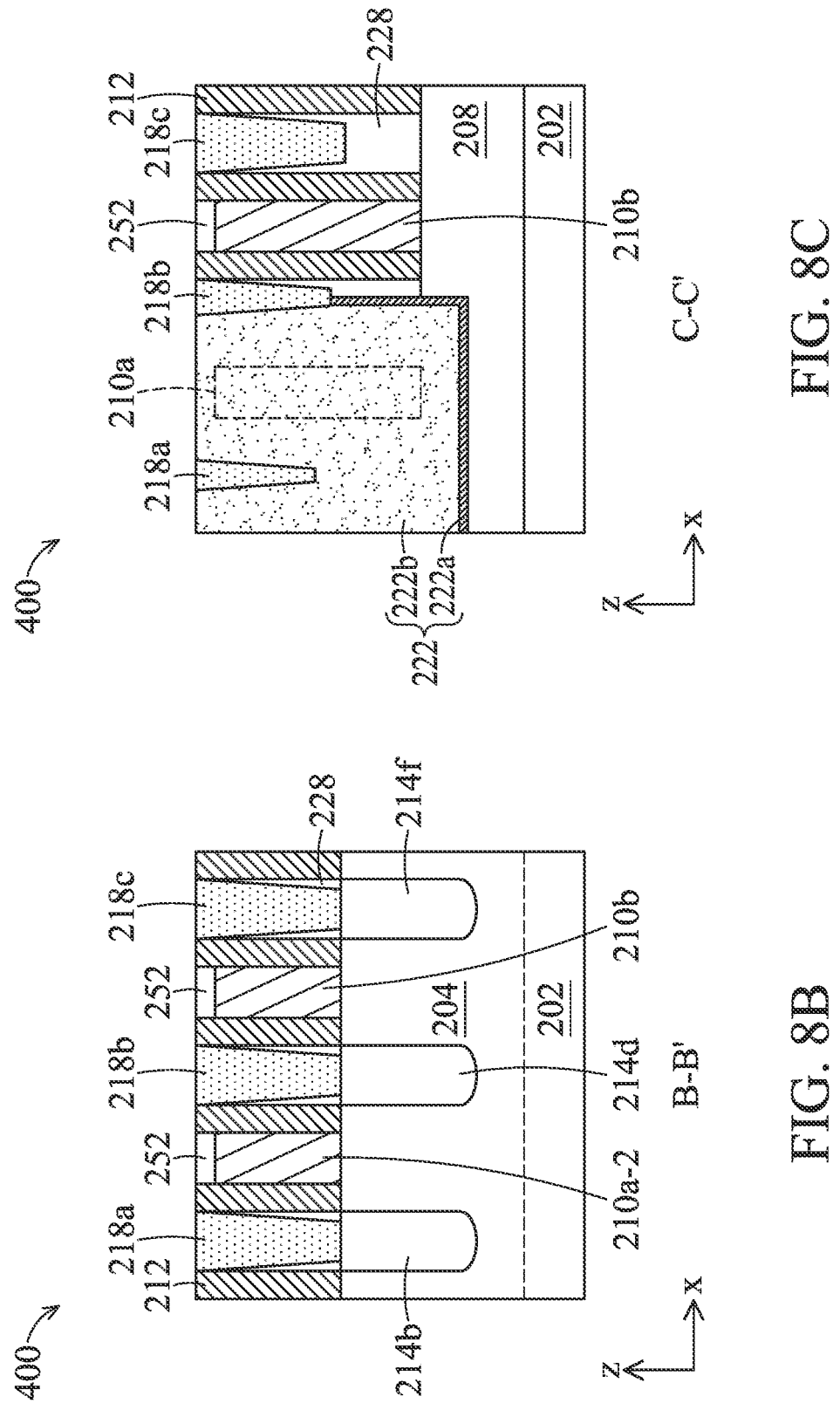
FIGS. 8B and 8C illustrate fragmentary cross-sectional views of the second alternative workpiece taken along line B-B' and line C-C' as shown in FIG. 8A, respectively, according to various aspects of the present disclosure.

FIG. 8A depicts a fragmentary top view of a second alternative workpiece 400, FIGS. 8B and 8C illustrate fragmentary cross-sectional views of the workpiece 400 taken along line B-B' and line C-C' as shown in FIG. 8A, respectively. The workpiece 400 represented in FIGS. 8A-8C is similar to the workpiece 200 described with reference to FIGS. 6A-6D. One of the differences between the workpiece 400 and the workpiece 200 includes that, in this alternative embodiment, the workpiece 400 includes a self-aligned cap (SAC) layer 252 formed over the metal gate structures 210a and 210b. In an example process, a SAC recess may be formed by removing (e.g., etching) top portions of the metal gate structures 210a and 210b. Then a dielectric material (not depicted) may be deposited over the workpiece 400 including the SAC recess by CVD, PECVD, or a suitable deposition process. The dielectric material may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. After the deposition of the dielectric material, a planarization process, such as a CMP process, may be performed to remove excess dielectric material over the dielectric structure 228, thereby forming the SAC layer 252 directly over the metal gate structures 210a and 210b. After the forming of the SAC layer 252, photolithography processes and etch processes are then performed to form the gate isolation trench 256. In the present embodiments, due to the recess of the metal gate structures 210a and 210b, a top surface of the source/drain contact 218a/218b/218c is above top surfaces of the recessed metal gate structures 210a and 210b. In embodiments, top surfaces of the source/drain contacts 218a. 218b, and 218c are coplanar with a top surface of the SAC layer 252.

In the depicted embodiment, sidewalls of the SAC layer 252 are in direct contact with the at least one gate spacer 212 and a bottom surface of the SAC layer 252 is in direct contact with top surfaces of the high-k dielectric layer and the metal gate electrode of the metal gate structures 210a and 210b. In some other implementations, the SAC layer 252 may have other configurations. For example, the SAC recess may be formed by recessing top portions of the metal gate structures 210a and 210b and recessing top portions of the gate spacers 212, and the resulted SAC layer 252 may be formed directly on the recessed gate spacers 212 and the metal gate structures 210a and 210b. Top surfaces of the recessed gate spacers 212 may be above top surfaces of the metal gate structures 210a and 210b.

Figures 9A, 9B:
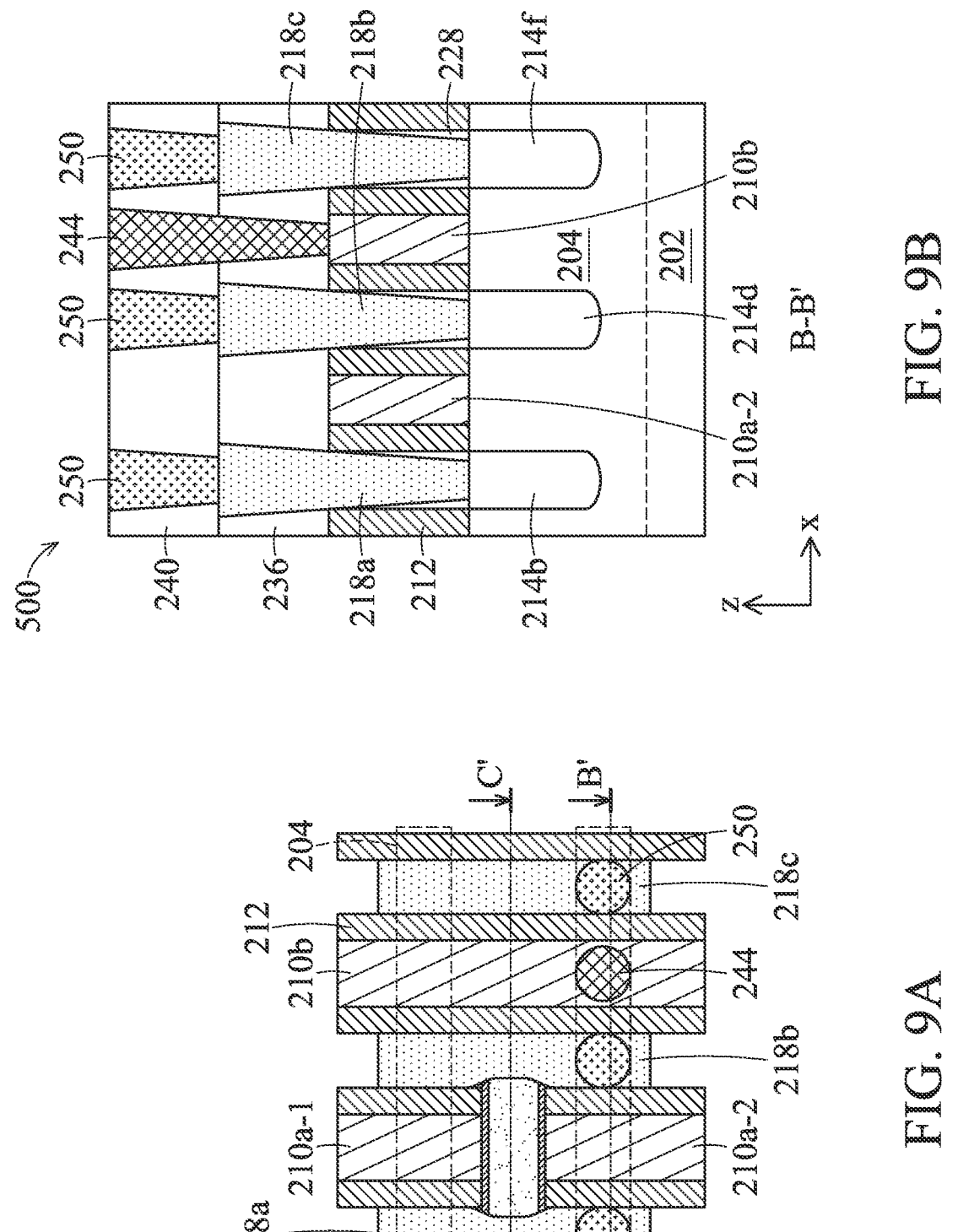
FIG. 9A illustrates a fragmentary top view of a third alternative workpiece, according to various aspects of the present disclosure.
FIG. 9B illustrates a fragmentary cross-sectional view of the third alternative workpiece taken along line B-B' as shown in FIG. 9A, according to various aspects of the present disclosure.

FIG. 9A depicts a fragmentary top view of a third alternative workpiece 500, FIG. 9B illustrates a fragmentary cross-sectional view of the workpiece 500 taken along line B-B' as shown in FIG. 9A. The workpiece 500 represented in FIGS. 9A-9B is similar to the workpiece 200 described with reference to FIGS. 6A-6D. One of the differences between the workpiece 500 and the workpiece 200 includes that, in this alternative embodiment, the configuration of the source/drain contacts of workpiece 500 are different from that of workpiece 200.

In embodiments, the workpiece 500 includes one or more dielectric structures 236 and 240 formed over the metal gate structures 210a and 210b, and the source/drain contacts 218a, 218b, and 218c extend upward above top surfaces of the metal gate structures 210a and 210b and extend through the dielectric structure 236. The workpiece 500 may further include one or more contact vias 250 embedded in the dielectric structure 240 and over and electrically coupled to the source/drain contacts 218a, 218b, and/or 218c, and a gate contact via 244 over and electrically coupled to the metal gate structure 210b. In embodiments, a cross-sectional view of the workpiece 500 along line C-C' may be similar to the workpiece 200 represented in FIG. 6C, except that the one or more dielectric structures 236 and 240 are disposed over the gate isolation structure 222, the dielectric structure 228, and the metal gate structures 210a and 210b, and the source/drain contacts 218a, 218b, and 218c extend upward into/through the dielectric structure 236.

In an example process, the dielectric structure 236 is formed over the dielectric structure 228. Lithography process(es) and etch process(es) are performed to the workpiece 500 to form the trenches 260a-260b through the dielectric structure 236, the dielectric structure 228, and the gate isolation structure 222, such that the upper surfaces of their respective source/drain features 214 below are exposed. In a subsequent process, the source/drain contacts 218a, 218b, and 218c are formed in the trenches 260a-260b, similar to the process described in FIGS. 6A-6D. Further processes may include forming dielectric structure 240 over the dielectric structure 236, forming contact vias 250 in the dielectric structure 240, and forming the gate contact via 244.

Figure 10:
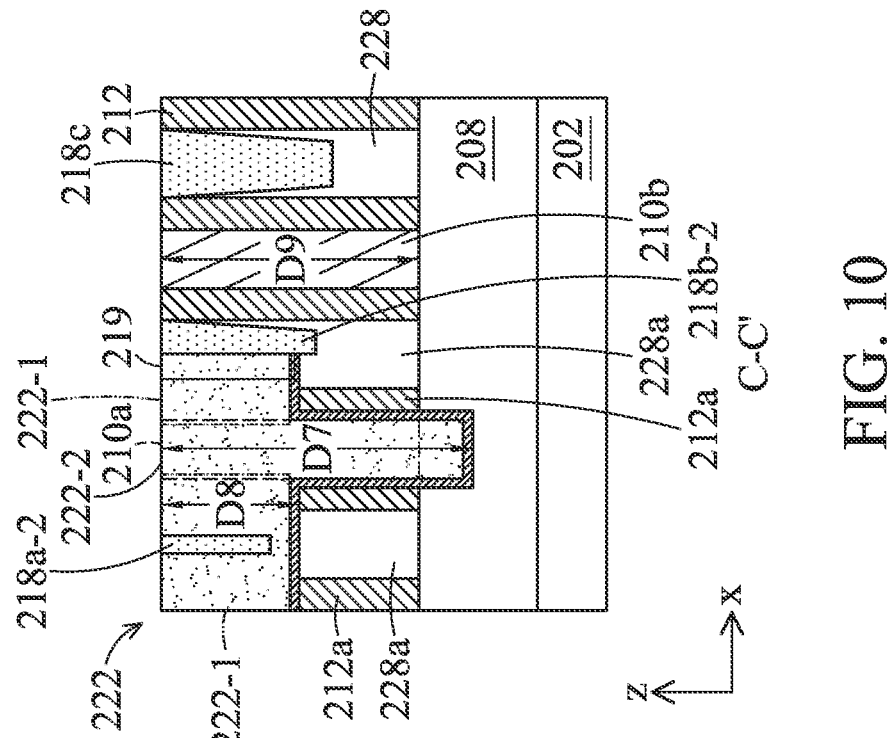
FIG. 10 illustrates a fragmentary cross-sectional view of the fourth alternative workpiece taken along line C-C', according to various aspects of the present disclosure.

FIG. 10 illustrates a fragmentary cross-sectional view of a fourth alternative workpiece 600. A fragmentary top view of the fourth alternative workpiece 600 is similar to FIG. 6A, a fragmentary cross-sectional view of the workpiece 600 taken along line B-B' as shown in FIG. 6A is similar to FIG. 6B. FIG. 10 illustrates a fragmentary cross-sectional view of the workpiece 600 taken along line C-C' as shown in FIG. 6A. In the above embodiments described with reference to FIGS. 6A-6D, to form the gate isolation trench 256, portions of the gate spacers 212 and the metal gate structure 210a exposed by the gate isolation trench 256 are substantially removed. In the fourth alternative embodiment represented in FIG. 10, when forming the gate isolation trench 256, a selective etching process is performed to selectively remove the portion of the metal gate structure 210a exposed by the gate isolation trench 256 while the exposed portions of the gate spacers 212 are slightly etched, such that a portion of the gate spacers 212 (also referred to as remaining gate spacers 212a) and a portion of the dielectric structure 228 (also referred to as a remaining dielectric structure 228a) are exposed by the gate isolation trench 256 after the selective etching process. In embodiments, sidewalls of the remaining gate spacers 212a are substantially not etched. Any suitable methods may be used in the selective etching process, such as wet etch, dry etch or a combination thereof using suitable etchants to etch various materials.

In the present embodiments, the gate isolation structure 222 formed in the gate isolation trench 256 includes a first part 222-1 directly above the remaining gate spacers 212a and a second part 222-2 between two adjacent remaining gate spacers 212a. In embodiments, the first part 222-1 of the gate isolation structure 222 is also directly above the remaining dielectric structure 228a. In some embodiments, the second part 222-2 of the gate isolation structure 222 extends into the isolation feature 208 and has a depth D7. The first part 222-1 of the gate isolation structure 222 has a depth D8. The depth D7 may be greater than a depth D9 of the metal gate structures 210a and 210b. In embodiments, a ratio of the depth D7 to the depth D9 is in a range of about 1.05 to about 3. If the ratio is too small, the gate isolation structure 222 may not completely divide the metal gate structure 210a into two isolated portions. If the ratio is too large, the gate isolation structure 222 may extend through the isolation feature 208 and extend into the substrate 202, leading to an increased leakage current. The depth D7 may be greater than the depth D8. In some embodiments, a ratio of the depth D7 to the depth D8 is in a range of about 1.05 to about 5.

Still referring to FIG. 10, an upper part of the second portion 218b-2 of the source/drain contact 218b is separated from the second part 222-2 of the gate isolation structure 222 by the first part 222-1 of the gate isolation structure 222, a lower part of the second portion 218b-2 of the source/drain contact 218b is separated from the second part 222-2 of the gate isolation structure 222 by the remaining dielectric structure 228a and the remaining gate spacer 212a. In the depicted embodiment, a bottom surface of the second portion 218b-2 of the source/drain contact 218b is below a top surface of the adjacent remaining gate spacer 212a. In some other embodiments, the bottom surface of the second portion 218b-2 of the source/drain contact 218b is coplanar with or above the top surface of the adjacent remaining gate spacer 212a. In some embodiments, the second portion 218a-2 of the source/drain contact 218a is directly above the remaining dielectric structure 228a. A bottom surface of the second portion 218a-2 of the source/drain contact 218a may be above, below, or at a same level with a top surface of the adjacent remaining gate spacer 212a.

Similar to the embodiments described with reference to FIG. 6C, the region 219 around the second portion 218b-2 of the source/drain contact 218b indicates a region where the source/drain contact 218b may be formed within even if there is, for example, an etch variation, overlay shift, during the formation of the trench 260b. For similar reasons as described above, possibility of the second portion 218b-2 being in direct contact with an end of the metal gate structure 210a is reduced. In addition, in some embodiments, because the gate spacer 212a are etched at a slower etching rate than the rate at which the gate isolation structure 222 is etched when forming the trench 260b, the adjacent remaining gate spacer 212a provides more burdens to avoid the second portion 218b-2 being in direct contact with an end of the metal gate structure 210a. Therefore, electrical short between the metal gate structure 210a and the second portion 218b-2 of the source/drain contact 218b may be avoided. For similar reasons, electrical short between the metal gate structure 210a and the second portion 218a-2 of the source/drain contact 218a is also eliminated.

Figures 11A, 11B:
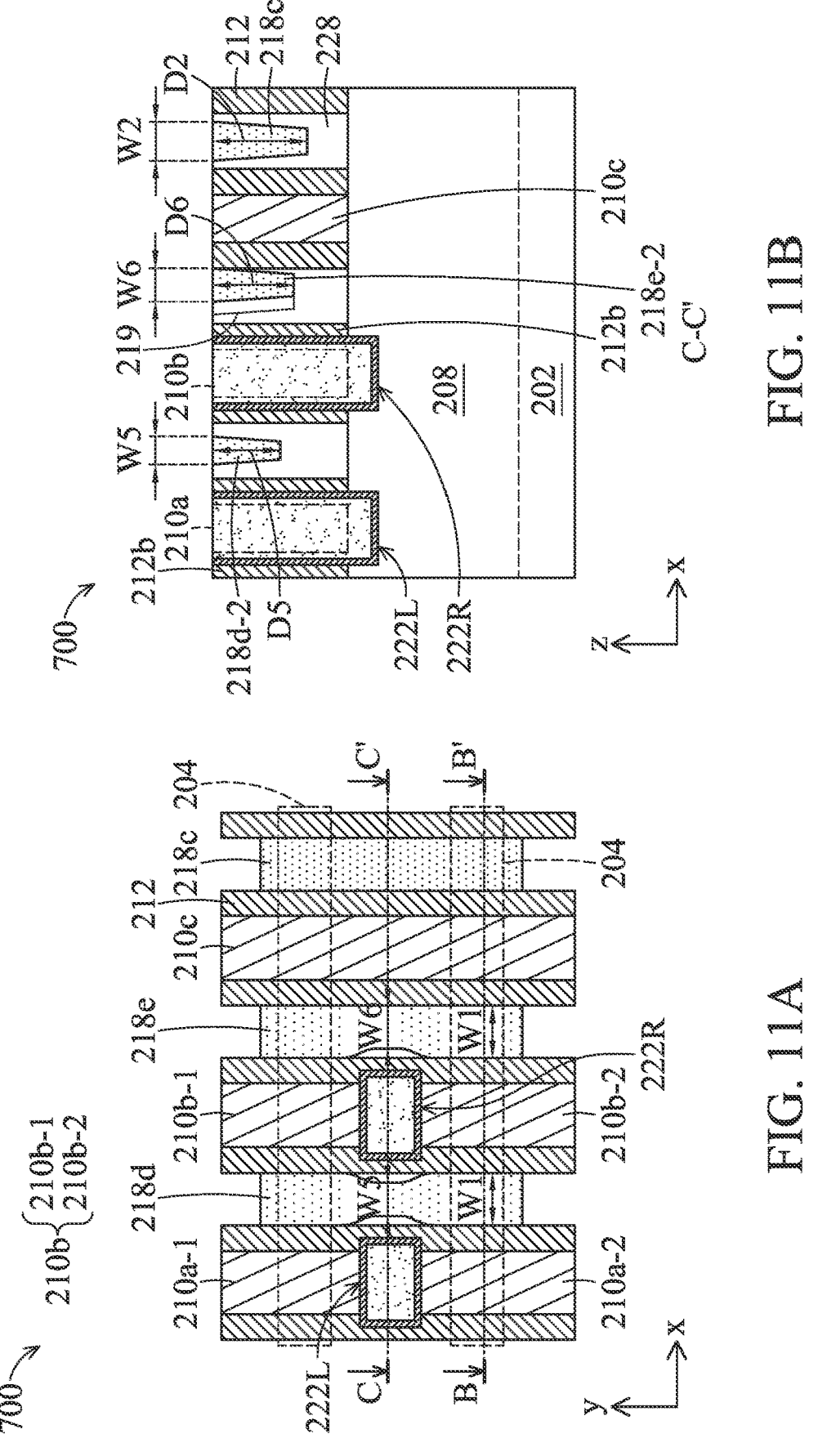
FIG. 11A illustrates a fragmentary top view of a fifth alternative workpiece, according to various aspects of the present disclosure.
FIG. 11B illustrates a fragmentary cross-sectional view of the fifth alternative workpiece taken along line C-C' as shown in FIG. 11A, according to various aspects of the present disclosure.
Figure 11C:
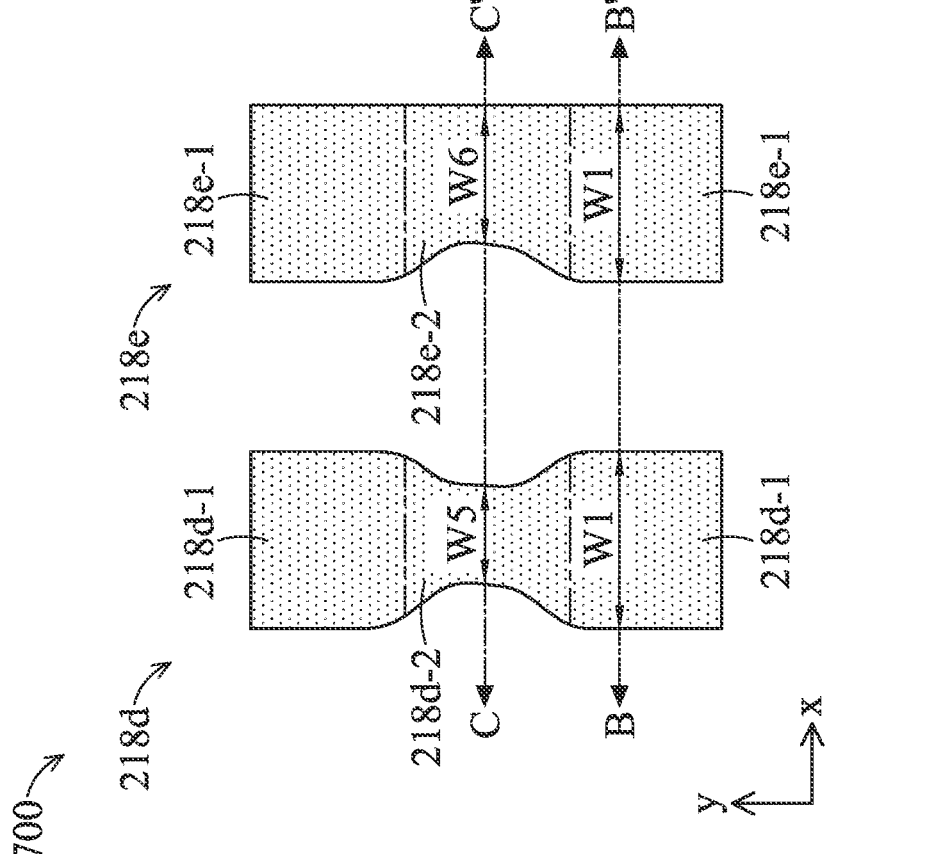
FIG. 11C illustrates enlarged fragmentary top views of portions of the fifth alternative workpiece, according to various aspects of the present disclosure.

FIG. 11A depicts a fragmentary top view of a fifth alternative workpiece 700, FIG. 11B illustrates a fragmentary cross-sectional view of the workpiece 700 taken along line C-C' as shown in FIG. 11A, FIG. 11C illustrates enlarged top views of source/drain contacts 218d and 218e. A fragmentary cross-sectional view of the workpiece 700 taken along line B-B' as shown in FIG. 11A is similar to FIG. 6B and is thus omitted for reason of simplicity. The workpiece 700 is similar to the workpiece 200 described with reference to FIGS. 6A-6C, and one of the differences between the workpiece 700 and the workpiece 200 includes that, the gate isolation structures of the workpiece 700 have different configurations than that of the workpiece 200. More specifically, the workpiece 700 includes a first gate isolation structure 222L configured to cut the metal gate structure 210a into two portions 210a-1 and 210a-2 (also referred to as metal gate structures 210a-1 and 210a-2, and collectively referred to as metal gate structure 210a) and a second gate isolation structure 222R configured to cut the metal gate structure 210b into two portions 210b-1 and 210b-2 (also referred to as metal gate structures 210b-1 and 210b-2, and collectively referred to as metal gate structure 210b). The formation of the first and second gate isolation structures 222L and 222R are similar to the formation of the gate isolation structure 222 except that each of the two gate isolation trenches (not depicted) spans a width less than that of the trench 256, and each of the two gate isolation trenches doesn't divide the gate spacers into physically isolated segments. That is, edges of each of the two gate isolation trenches are also confined by two partially etched gate spacers 212. As a result, as represented in FIGS. 11A-11C, the portion (also referred to as remaining gate spacer 212b) of the gate spacer 212 that is disposed directly over the isolation feature 208 and in direct contact with the gate isolation structure 222L/222R has a width along the X direction less than that of the portion of the gate spacer 212 that is disposed directly on the sidewall surface of the metal gate structures 210a and 210b, and the remaining gate spacer 212b is in direct contact with the gate isolation structure 222L or 222R. The remaining gate spacers 212b have the same height as the portion of the gate spacers 212 that is disposed directly on the sidewall surface of the metal gate structures 210a and 210b.

Similar to the source/drain contact 218a in FIGS. 6A-6D, referring to FIGS. 11A-11C, the source/drain contact 218d has two first portions 218d-1 directly above the source/drain features 214a and 214b and a second portion 218d-2 extending between the two first portions 218d-1. The second portion 218d-2 is between and adjacent to the two gate isolation structures 222L and 222R. In embodiments represented in FIG. 11B, the second portion 218d-2 is embedded in the dielectric structure 228, which is between two adjacent remaining gate spacers 212b. More specifically, the second portion 218d-2 is spaced apart from the gate isolation structures 222L and 222R by the remaining gate spacers 212b and the dielectric structure 228.

Similar to the source/drain contact 218b in FIGS. 6A-6D, the source/drain contact 218e has two first portions 218e-1 directly above the source/drain features 214c and 214d and a second portion 218e-2 extending between the two first portions 218e-1. The second portion 218e-2 is adjacent to the gate isolation structure 222R on one side. In embodiments, the second portion 218e-2 is embedded in the dielectric structure 228, which is between an adjacent remaining gate spacer 212b and an adjacent gate spacer 212. In embodiments, the second portion 218e-2 is spaced apart from the gate isolation structure 222R by the remaining gate spacer 212b and the dielectric structure 228. In some embodiments, the source/drain contact 218e is in direct contact with an adjacent gate spacer 212.

Similar to the embodiments described with reference to FIG. 6C, the region 219 (shown in FIG. 11B) indicates a region where the source/drain contact 218e may be formed within even if there is, for example, an etch variation, overlay shift, during the formation of the trench 260e (the trench for the source/drain contact 218e, not depicted). In embodiments, the gate spacers 212 are etched at a slower etching rate than that of the dielectric structure 228. Thus, during the formation of the trench 260e, the dielectric structure 228 is etched more than the gate spacers 212. For similar reasons as described above, possibility of the second portion 218e-2 being in direct contact with an end of the metal gate structure 210b is reduced. In addition, in some embodiments, because the remaining gate spacer 212b is etched at a slower etching rate than the isolation gate structure 222R when forming the trench 260e, the adjacent remaining gate spacer 212b provides more burdens to avoid the second portion 218e-2 being in direct contact with an end of the metal gate structure 210b. Therefore, electrical short between the metal gate structure 210b and the second portion 218e-2 of the source/drain contact 218e is avoided. For similar reasons, electrical short between the metal gate structures 210a and 210b and the second portion 218d-2 of the source/drain contact 218d is also eliminated.

The source/drain contacts 218d and 218e have similar shapes as the source/drain contacts 218a and 218b, respectively. In embodiments, the second portion 218d-2 of the source/drain contact 218d has a width W5 along the X direction and a depth D5 along the Z direction. In embodiments, the width W5 is smaller than the width W1. In some embodiments, a ratio of the width W5 to the width W1 (i.e., W5/W1) is in a range of about 0.5 to about 0.95. If W5/W1 is too small, contact resistance between the source/drain contact 218d and the source/drain features (e.g., source/drain features 214a and 214b) thereunder may be too large. If W5/W1 is too large, the second portion 260d-2 may be too close to the adjacent metal gate structures 210a and 210b, electrical short between the metal gate structures 210a and 210b and the source/drain contact 218d may persist. In embodiments, the depth D5 is smaller than the depth D1. In an embodiment, a ratio of the depth D5 to the depth D1 is in a range of about 0.3 to about 0.95.

In embodiments, the second portion 218e-2 of the source/drain contact 218e has a width W6 along the X direction and a depth D6 along the Z direction. In some embodiments, the width W6 is smaller than the width W1. In embodiments, a ratio of the width W6 to the width W1 (i.e., W6/W1) is in a range of about 0.5 to about 0.95, alternatively in a range of about 0.7 to about 0.95. If W6/W1 is too small, contact resistance between the source/drain contact 218e and the source/drain features (e.g., source/drain features 214c and 214d) thereunder may be too large. If W6/W1 is too large, the second portion 260e-2 may be too close to the adjacent metal gate structure 210b, electrical short between the metal gate structure 210b and the source/drain contact 218e may persist. In some embodiments, the depth D6 is smaller than the depth D1. In an embodiment, a ratio of the depth D6 to the depth D1 is in a range of about 0.5 to about 0.95.

In some embodiments, the width W6 is equal to or greater than the width W5. In some embodiments, a ratio of the width W5 to the width W6 (i.e., W5/W6) is in a range of about 0.7 to about 1. If W5/W6 is too small, contact resistance between the source/drain contact 218d and the source/drain features (e.g., source/drain features 214a and 214b) thereunder may be too large, affecting an overall performance of the semiconductor structure or the second portion 218e-2 may be too close to the adjacent metal gate structure 210b, electrical short between the metal gate structure 210b and the source/drain contact 218e may persist. If W5/W6 is too large, contact resistance between the source/drain contact 218e and the source/drain features (e.g., source/drain features 214c and 214d) thereunder may be too large, affecting an overall performance of the semiconductor structure or the second portion 218d-2 may be too close to the adjacent metal gate structures 210a and 210b, electrical short between the metal gate structures 210a and 210b and the source/drain contact 218d may persist. In some embodiments, the depth D6 is equal to or greater than the depth D5. In an embodiment, a ratio of the depth D5 to the depth D6 is in a range of about 0.5 to about 1.

Figures 12A, 12B:
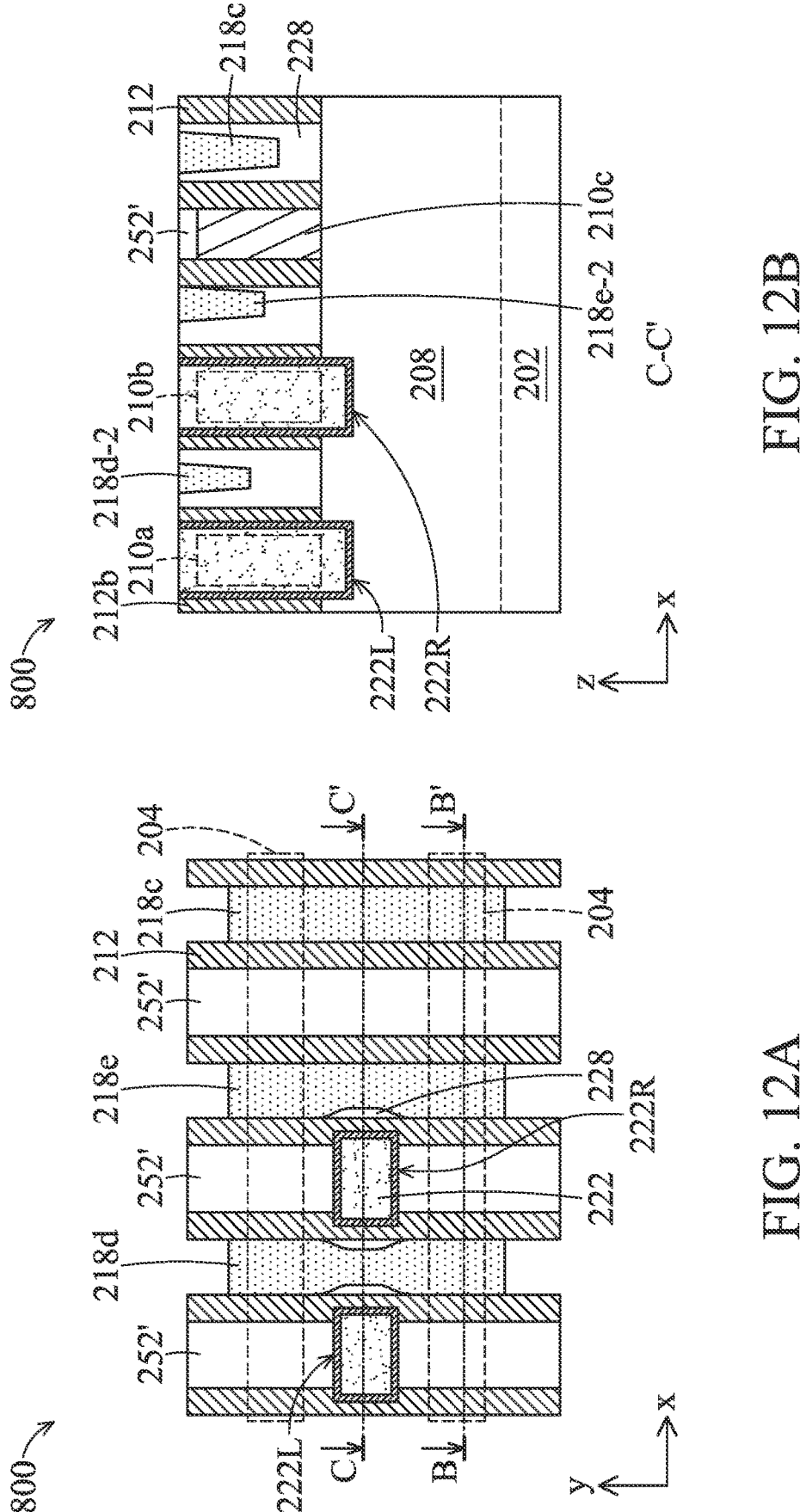
FIG. 12A illustrates a fragmentary top view of a sixth alternative workpiece, according to various aspects of the present disclosure.
FIG. 12B illustrates a fragmentary cross-sectional view of the sixth alternative workpiece taken along line C-C' as shown in FIG. 12A, according to various aspects of the present disclosure.

FIG. 12A depicts a fragmentary top view of a sixth alternative workpiece 800, FIG. 12B illustrates a fragmentary cross-sectional view of the workpiece 800 taken along line C-C' as shown in FIG. 12A. A fragmentary cross-sectional view of the workpiece 800 taken along line B-B' as shown in FIG. 12A is similar to FIG. 8B. One of the differences between the workpiece 800 and the workpiece 700 includes that, in this alternative embodiment, the workpiece 800 includes a SAC layer 252' formed over the metal gate structures 210a and 210b. The SAC layer 252' may have the same material as and is formed similarly to the SAC layer 252 described in FIGS. 8A-8C. In some embodiments, top surfaces of the source/drain contacts 218d, 218c, and 218c are above top surfaces of the metal gate structures 210.

Figures 13A, 13B:
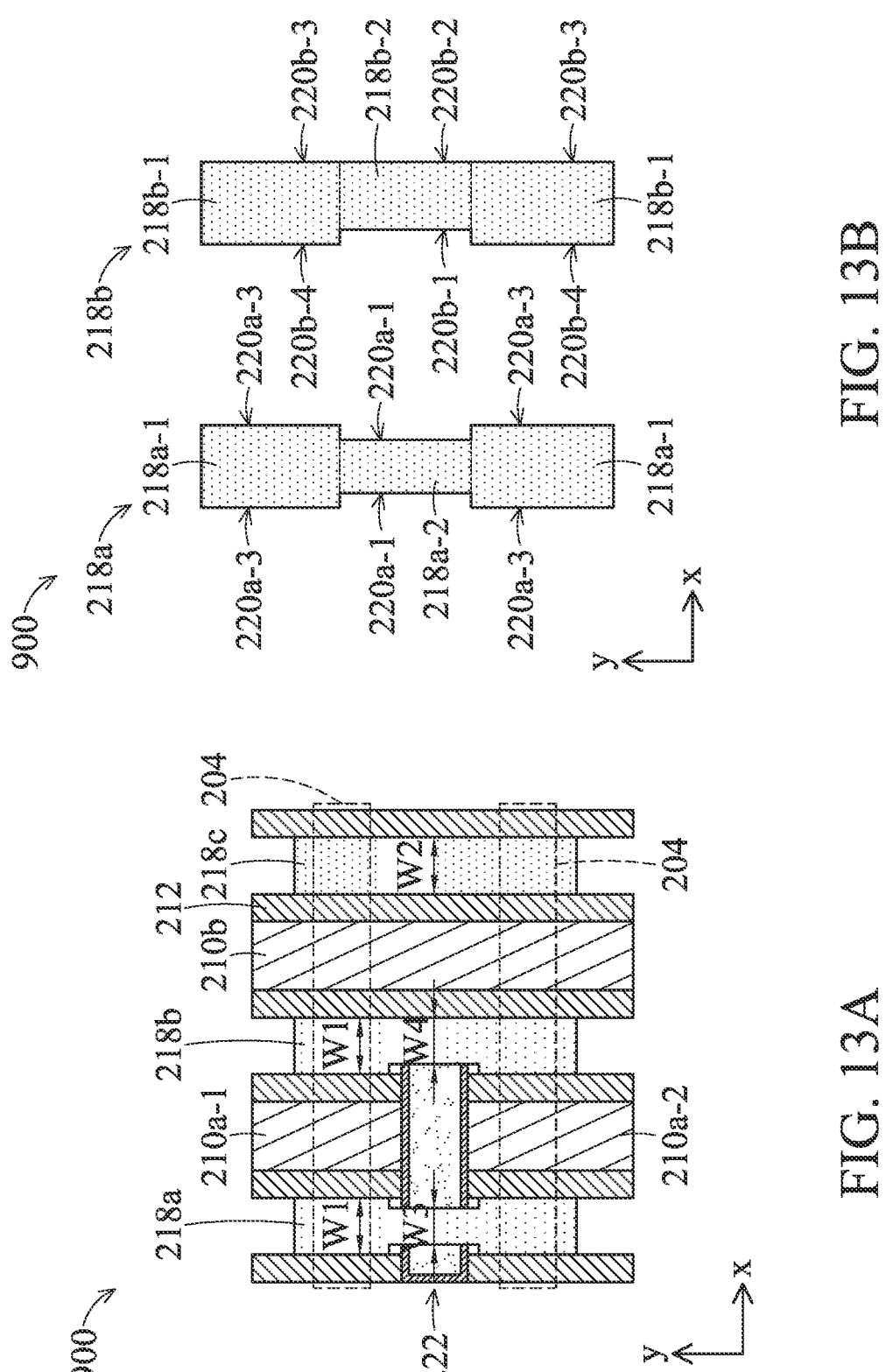
FIG. 13A illustrates a fragmentary top view of a seventh alternative workpiece, according to various aspects of the present disclosure.
FIG. 13B illustrates enlarged fragmentary top views of portions of the seventh alternative workpiece, according to various aspects of the present disclosure.

In the above embodiments described with reference to FIGS. 6A-12A, the source/drain contact is configured to have a non-uniform width along its length direction, and example top views of the source/drain contact are shown. In some alternative embodiments, from a top view, the source/drain contacts (e.g., 218a and 218b) have different shapes. FIG. 13A depicts a fragmentary top view of a seventh alternative workpiece 900. FIG. 13B illustrates enlarged top views of the source/drain contacts 218a and 218b. One of the differences between the workpiece 900 and the workpiece 200 includes that, in this alternative embodiment, from a top view, the two edges 220a-1 of the second portion 218a-2 of the source/drain contact 218a and a first edge 220b-1 of the second portion 218b-2 of the source/drain contact 218b are substantially straight and recessed from the edges 220a-3 and 220b-4 of the first portions 218a-1 and 218b-1, respectively. In other words, from a top view, a profile of the source/drain contact 218a resembles a dumbbell shape. The dimensions (e.g., widths, depths) of the source/drain contacts 218a and 218b may be the same as described before.

Various combinations of the embodiments of the semiconductor structure and the method of making the same are within the scope of the present disclosure. For example, a workpiece may include the SAC layer 252 and the dielectric barrier layer 232. In another example, the source/drain contacts 218a, 218b, 218c, 218d, and/or 218e extend above a top surface of the metal gate structures 210a and 210b and have a shape shown in FIGS. 13A-13B. The source/drain contacts 218a, 218b, 218c, 218d, and/or 218e may be arranged in any number and any position relative to each other.

Although not intended to be limiting, one or more embodiments of the present disclosure provide many benefits to a semiconductor structure and the formation thereof. For example, one advantage is that the present disclosure reduces/avoids the electrical short between source/drain contacts and the adjacent metal gate structure(s) without sacrificing a relative low contact resistance between the source/drain contacts and the source/drain features thereunder. The present disclosure is compatible to various semiconductor fabrication processes, and compatible to various semiconductor structures (e.g., semiconductor structures having a SAC layer and/or a dielectric barrier layer). The semiconductor structure may include a planar transistor or a multi-gate device, such as FinFET, GAA, nanosheet, forksheet, or CFET.

The present disclosure provides for many different embodiments. Semiconductor structures and methods of fabrication thereof are disclosed herein. In one exemplary aspect, the present disclosure is directed to a semiconductor structure including a source/drain feature over a substrate, a metal gate structure extending lengthwise along a first direction and adjacent to the source/drain feature, and a gate isolation structure extending lengthwise along a second direction substantially perpendicular to the first direction. The gate isolation structure divides the metal gate structure into two isolated portions. The semiconductor structure further includes a source/drain contact electrically coupled to the source/drain feature and having a first portion directly above the source/drain feature and a second portion extending from the first portion along the first direction. The first portion has a first width along the second direction and the second portion has a second width along the second direction. The first width is greater than the second width.

In some embodiments, the second portion of the source/drain contact includes two edges curved inward from a top view. In some embodiments, from a cross-sectional view, a boundary of the gate isolation structure is directly under the second portion of the source/drain contact. In some embodiments, the first portion of the source/drain contact has a first depth and the second portion of the source/drain contact has a second depth less than the first depth. In some embodiments, the semiconductor structure further includes an isolation feature over the substrate and under the gate isolation structure, and gate spacers extending lengthwise along the first direction and including a first part on sidewalls of the metal gate structure and a second part disposed directly over the isolation feature. The second part of the gate spacers is directly under a first part of the gate isolation structure. In some embodiments, the gate isolation structure further includes a second part adjacent to the second part of the gate spacers. The second part of the gate isolation structure extends into the isolation feature and has a bottom surface lower than a bottom surface of the first part of the gate isolation structure. In some embodiments, a top surface of the source/drain contact is above a top surface of the metal gate structure. In some embodiments, the source/drain feature is a first source/drain feature and the source/drain contact is a first source/drain contact. The semiconductor structure further includes a second source/drain feature, such that the metal gate structure is disposed between the first and the second source/drain features. In some embodiments, the semiconductor structure further includes a second source/drain contact electrically coupled to the second source/drain feature and having a third portion directly above the second source/drain feature and a fourth portion extending from the third portion along the first direction. The third portion has a third width and the fourth portion has a fourth width less than the third width. In some embodiments, the fourth portion of the second source/drain contact includes a first edge curved inward and a second edge opposite to the first edge and aligned with an edge of the third portion from a top view. In some embodiments, the fourth portion of the second source/drain contact has a depth less than a depth of the third portion of the second source/drain contact and greater than a depth of the second portion of the first source/drain contact.

In another exemplary aspect, the present disclosure is directed to a semiconductor structure including a first and a second source/drain features over a substrate, a first and a second metal gate structures extending lengthwise along a first direction over the substrate and adjacent to the first and the second source/drain features, respectively, and a gate isolation structure extending lengthwise along a second direction substantially perpendicular to the first direction. The first and the second metal gate structures are isolated by the gate isolation structure. The semiconductor structure further includes a source/drain contact including two first portions directly over the first and second source/drain features and a second portion connecting the two first portions. The second portion is adjacent to the gate isolation structure, and the two first portions and the second portion have different widths.

In some embodiments, the second portion of the source/drain contact is embedded in the gate isolation structure. In some embodiments, the second portion of the source/drain contact is directly above a part of the gate isolation structure and in direct contact with a sidewall of the gate isolation structure. In some embodiments, the semiconductor structure further includes an isolation feature disposed between the first and second source/drain features and gate spacers having a first portion on sidewalls of the first and the second metal gate structures and a second portion disposed directly over the isolation feature. The second portion of the source/drain contact is spaced apart from the gate isolation structure by the second portion of the gate spacers. In some embodiments, the semiconductor structure further includes a dielectric layer adjacent to the gate spacers, wherein the source/drain contact is embedded in the dielectric layer. In some embodiments, from a top view, a profile of the source/drain contact resembles a dumbbell shape.

In yet another exemplary aspect, the present disclosure is directed to a semiconductor structure including a substrate and a first and a second active regions over the substrate and in parallel to each other. The first active region includes a first source/drain feature, and the second active region includes a second source/drain feature. The semiconductor structure further includes a metal gate structure extending lengthwise along a first direction, over the first and the second active regions, and adjacent to the first and the second source/drain features. The semiconductor structure further includes a source/drain contact including two first portions directly over the first and the second source/drain features, respectively, and a second portion extending between the two first portions. The two first portions have a first width along a second direction substantially perpendicular to the first direction and the second portion has a second width along the second direction. The first width is greater than the second width.

In some embodiments, the semiconductor structure further includes gate spacers on sidewalls of the metal gate structure and a gate isolation structure extending lengthwise along the second direction and between the first and the second active regions. The gate isolation structure divides the metal gate structure into two isolated portions and includes a dielectric material different from the gate spacers. In some embodiments, the gate isolation structure includes an outer layer and an inner layer embedded in the outer layer. In some embodiments, the semiconductor structure further includes a first and a second gate isolation structures extending lengthwise along the second direction and between the first and the second active regions. The first gate isolation structure divides the metal gate structure into two isolated portions, and the second portion of the source/drain contact is between the first and the second gate isolation structures.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source/drain feature over a substrate;
   a metal gate structure extending lengthwise along a first direction and adjacent to the source/drain feature;

a gate isolation structure extending lengthwise along a second direction substantially perpendicular to the first direction, wherein the gate isolation structure divides the metal gate structure into two isolated portions; and
   a source/drain contact electrically coupled to the source/drain feature and including a first portion directly above the source/drain feature and a second portion extending from the first portion along the first direction,
   wherein a first top surface of the first portion and a second top surface of the second portion are aligned,
   wherein the first portion has a first width along the second direction and the second portion has a second width along the second direction, the first width being greater than the second width.

2. The semiconductor structure of claim 1, wherein the second portion of the source/drain contact includes two edges curved inward from a top view.

3. The semiconductor structure of claim 1, wherein from a cross-sectional view, a boundary of the gate isolation structure is directly under the second portion of the source/drain contact.

4. The semiconductor structure of claim 1, wherein the first portion of the source/drain contact has a first depth and the second portion of the source/drain contact has a second depth less than the first depth.

5. The semiconductor structure of claim 1, further comprising:
   an isolation feature over the substrate and under the gate isolation structure; and
   gate spacers extending lengthwise along the first direction and including a first part on sidewalls of the metal gate structure and a second part disposed directly over the isolation feature, wherein the second part of the gate spacers is directly under a first part of the gate isolation structure.

6. The semiconductor structure of claim 5, wherein the gate isolation structure further includes a second part adjacent to the second part of the gate spacers, wherein the second part of the gate isolation structure extends into the isolation feature and has a bottom surface lower than a bottom surface of the first part of the gate isolation structure.

7. The semiconductor structure of claim 1, wherein the first top surface is above a top surface of the metal gate structure.

8. The semiconductor structure of claim 1, wherein the source/drain feature is a first source/drain feature and the source/drain contact is a first source/drain contact,
   wherein the semiconductor structure further comprises:
   a second source/drain feature, such that the metal gate structure is disposed between the first and the second source/drain features, and
   a second source/drain contact electrically coupled to the second source/drain feature and having a third portion directly above the second source/drain feature and a fourth portion extending from the third portion along the first direction,
   wherein the third portion has a third width and the fourth portion has a fourth width less than the third width.

9. The semiconductor structure of claim 8, wherein the fourth portion of the second source/drain contact includes a first edge curved inward and a second edge opposite to the first edge and aligned with an edge of the third portion from a top view.

10. The semiconductor structure of claim 9, wherein the fourth portion of the second source/drain contact has a depth less than a depth of the third portion of the second source/ drain contact and greater than a depth of the second portion of the first source/drain contact.

11. A semiconductor structure, comprising:

a first and a second source/drain features over a substrate;

a first and a second metal gate structures extending lengthwise along a first direction over the substrate and adjacent to the first and the second source/drain features, respectively;

a gate isolation structure extending lengthwise along a second direction substantially perpendicular to the first direction, wherein the first and the second metal gate structures are isolated by the gate isolation structure; and a source/drain contact including two first portions directly over the first and second source/drain features and a second portion connecting the two first portions, wherein the second portion is on a sidewall of the gate isolation structure, and wherein the two first portions and the second portion have different widths along the second direction.

12. The semiconductor structure of claim 11, wherein the second portion of the source/drain contact is embedded in the gate isolation structure.

13. The semiconductor structure of claim 11, wherein the second portion of the source/drain contact is directly above a part of the gate isolation structure.

14. The semiconductor structure of claim 11, further comprising:

an isolation feature disposed between the first and second source/drain features; and gate spacers having a first portion on sidewalls of the first and the second metal gate structures and a second portion disposed directly over the isolation feature, wherein the second portion of the source/drain contact is spaced apart from the gate isolation structure by the second portion of the gate spacers.

15. The semiconductor structure of claim 14, further comprising: a dielectric layer adjacent to the gate spacers, wherein the source/drain contact is embedded in the dielectric layer.

16. The semiconductor structure of claim 11, wherein from a top view, a profile of the source/drain contact resembles a dumbbell shape.

17. A semiconductor structure, comprising:

a substrate;

a first and a second active regions over the substrate and in parallel to each other, wherein the first active region includes a first source/drain feature, and the second active region includes a second source/drain feature;

a metal gate structure extending lengthwise along a first direction, over the first and the second active regions, and adjacent to the first and the second source/drain features; and a source/drain contact including two first portions directly over the first and the second source/drain features, respectively, and a second portion extending between the two first portions, wherein the second portion shares a continuous edge with the two first portions in a top view, wherein the two first portions have a first width along a second direction substantially perpendicular to the first direction and the second portion has a second width along the second direction, the first width being greater than the second width.

18. The semiconductor structure of claim 17, further comprising:

gate spacers on sidewalls of the metal gate structure; and a gate isolation structure extending lengthwise along the second direction and between the first and the second active regions, wherein the gate isolation structure divides the metal gate structure into two isolated portions and includes a dielectric material different from the gate spacers.

19. The semiconductor structure of claim 18, wherein the gate isolation structure includes an outer layer and an inner layer embedded in the outer layer.

20. The semiconductor structure of claim 17, further comprising a first and a second gate isolation structures extending lengthwise along the second direction and between the first and the second active regions, wherein the first gate isolation structure divides the metal gate structure into two isolated portions, and wherein the second portion of the source/drain contact is between the first and the second gate isolation structures.

* * * * *